(12) United States Patent
Maeda et al.

(10) Patent No.: US 7,587,180 B2
(45) Date of Patent: Sep. 8, 2009

(54) FM MODULATOR

(75) Inventors: Masakatsu Maeda, Kyoto (JP); Kaoru Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 415 days.

(21) Appl. No.: 11/583,176

(22) Filed: Oct. 19, 2006

(65) Prior Publication Data
US 2007/0093217 A1  Apr. 26, 2007

(30) Foreign Application Priority Data
Oct. 21, 2005  (JP) .............................. 2005-307661

(51) Int. Cl.
H04B 1/04 (2006.01)
(52) U.S. Cl. .................... 455/110; 455/76; 455/23; 455/264
(58) Field of Classification Search ................. 455/110, 455/76, 23, 264
See application file for complete search history.

(56) References Cited
U.S. PATENT DOCUMENTS
7,002,415 B2 *  2/2006  Tsyrganovich .............. 331/1 R 2006/0055467 A1  3/2006  Ochi et al.

FOREIGN PATENT DOCUMENTS
| JP | 5-25810 | 4/1993 |
| JP | 10-115677 | 5/1998 |
| JP | 11-4201 | 1/1999 |
| JP | 2005-72876 | 3/2005 |

OTHER PUBLICATIONS

Thomas Olsson et al., "A digitally Controlled PLL for SoC Applications", IEEE Journal of Solid-State Circuits, vol. 39, No. 5, May 2004, Fig. 6., pp. 751-759.

* cited by examiner

*Primary Examiner*—Sanh D Phu
(74) *Attorney, Agent, or Firm*—Wenderoth, Lind & Ponack, L.L.P.

(57) ABSTRACT

An FM modulator measuring an f-V characteristic of a voltage controlled oscillator in a reduced time period. In the FM modular a characteristic measurement time control section 110 notifies a correction section 108 of a time at which a measurement of the f-V characteristic of a voltage controlled oscillator 103 is to start and a time at which the measurement of the f-V characteristic of the voltage controlled oscillator 103 is to and while a carrier wave frequency is being changed to a predetermined frequency. Thus, the correction section 108 measures the f-V characteristic of the voltage controlled oscillator 103 in a reduced time period.

12 Claims, 20 Drawing Sheets

FIG. 4

| INPUT VALUE FROM CORRECTION SECTION (108, 108a, 204, 204a) | FREQUENCY OF SIGNAL OUTPUTTED BY VCO |
|---|---|
| a1 | f1 |
| a2 | f2 |
| ↓ | ↓ |
| | |

FM MODULATOR

BACKGROUND OF THE INVENTION

1. Field of the Invention

The present invention relates to an FM modulator, and more particularly to an FM modulator using a voltage controlled oscillator.

2. Description of the Background Art

FIG. 17 is a diagram illustrating a structure of a conventional analog FM modulator. As shown in FIG. 17, the FM modulator 90 comprises a reference signal generator 91, a control circuit 92, and a voltage controlled oscillator 93 (hereinafter, referred to as a VCO 93). The control circuit 92 includes a phase comparator 911, a low pass filter (hereinafter, referred to as an LPF) 912, an adder 913, a frequency divider 914, a VCO gain correction section 915, and multipliers 916 and 917.

With reference to FIG. 17, the control circuit 92 and the VCO 93 constitutes a phase locked loop circuit (hereinafter, referred to a PLL circuit). The PLL circuit detects for a phase difference between a reference signal and a signal obtained by frequency-dividing an output signal outputted by the VCO so as to synchronize a phase of the reference signal and a phase of the signal obtained by frequency-dividing the output signal outputted by the VCO, thereby locking a phase of the output signal outputted by the VCO.

The VCO 93 outputs the output signal in accordance with a control voltage applied to a VCO control terminal. A relationship between the control voltage and the output signal outputted by the VCO in accordance with the control voltage is referred to as an f-V characteristic. The VCO 93 shown in FIG. 17 receives, from the VCO gain correction section 915, a correction signal used for correcting a nonlinear f-V characteristic of the VCO 93, so as to perform an output equivalent to that from a VCO having a linear characteristic.

The phase comparator 911 compares a phase of an output signal from the multiplier 917 with a phase of an output signal from the frequency divider 914, thereby outputting a pulse signal based on a comparison result. Specifically, the phase comparator 911 detects for a phase difference between a signal outputted by the multiplier 917 and a signal outputted by the frequency divider 914, thereby outputting a pulse signal having a pulse width corresponding to the time difference.

The LPF 912 eliminates a high frequency component from the pulse signal outputted by the phase comparator 911 by using, for example, an integration and averaging, so as to output only a DC component. Through this operation, the LPF 912 is capable of converting the pulse signal into a DC signal based on a magnitude of a phase difference. The DC signal obtained through the conversion is outputted to the VCO gain correction section 915 through the adder 913.

When the f-V characteristic of the VCO 93 is nonlinear, the VCO gain correction section 915 outputs a corrected signal so as to obtain an output equivalent to that from a VCO having a linear characteristic. In order to output the corrected signal, the VCO gain correction section 915 stores, for example, a correction table in which the control voltages applied to the VCO control terminal are associated with the output signals from the VCO 93, respectively.

The output signal from the VCO 93 is inputted to the multiplier 916 and multiplied by a modulation signal which is inputted to the FM modulator 90 from outside thereof, and a signal obtained through the multiplication is inputted to the frequency-divider 914. The frequency-divider 914 subjects a frequency of the signal having been received to 1÷N frequency division, and outputs a frequency-divided signal. Hereinafter, N is referred to as a frequency dividing ratio. Further, a signal obtained by adding channel data to the modulation signal is inputted to the frequency divider 914. The frequency divider 914 determines the frequency dividing ratio based on the channel data contained in the added signal having been received. A frequency of a carrier wave outputted by the FM modulator 90 shown in FIG. 17 is determined based on a product of the frequency dividing ratio used by the frequency divider 914 and a frequency of the reference signal generated by the reference signal generator 91. For example, when the frequency of the reference signal generated by the reference signal generator 91 is 100 kHz and the frequency dividing ratio N is 50, the frequency of the carrier wave is determined as 100 kHz×50=5.0 MHz.

The PLL circuit shown in FIG. 17 feeds back the output signal from the VCO 93 to the control circuit 92 via the frequency divider 914 so as to reduce, to almost zero, the phase difference between the output signal from the VCO 93 and the output signal from the multiplier 917, thereby enabling synchronization between the modulation signal inputted to the FM modulator 90 from outside thereof and the output signal from the VCO 93.

The FM modulation described with reference to FIG. 17 refers to a change of a frequency of the reference signal in accordance with a frequency signal inputted to the FM modulator from outside thereof. Specifically, the FM modulation is realized by applying, to the VCO control terminal, the control voltage which varies based on a certain voltage as time passes. In FIG. 17, a plurality of modulation signals are simultaneously inputted to the FM modulator 90 from outside thereof so as to obtain low-frequency to high-frequency modulation characteristics of the PLL circuit including the control circuit 92 and the VCO 93. The modulation signals are inputted to the multiplier 917, the frequency divider 914, and the multiplier 916 so as to obtain the low frequency modulation characteristic. On the other hand, the modulation signal is inputted to the adder 913 so as to obtain the high frequency modulation characteristic.

FIG. 18 is a diagram illustrating an FM modulation performed by the VCO 93. In FIG. 18, a straight line C1 represents a linear characteristic of a VCO. That is, a value obtained by dividing the VCO output frequency by the VCO control terminal voltage is constant. A curved line C2 represents a nonlinear characteristic of the VCO 93. A curved line S1 represents the control voltage applied to the VCO control terminal of the VCO 93. The curved line S2 represents an output, corresponding to the curved line S1, obtained by the VCO having the characteristic represented by C1. The curved line S3 represents an output, corresponding to the curved line S1, obtained by the VCO 93 having the characteristic represented by C2. In FIG. 18, V[V] represents the control voltage applied to the VCO control terminal, and f[Hz] represents an oscillation frequency of the VCO. Vcc [V] represents an upper limit value of the control voltage applied to the VCO.

When the f-V characteristic of the VCO 93 is a nonlinear one as represented by the curved line C2, the output corresponding to the control voltage S1 applied to the VCO 93 has an unfavorable wave form as represented by the curved line S3. The unfavorable output degrades the characteristic of the FM modulator 90.

FIG. 19 is a diagram illustrating a correction method performed by the VCO gain correction section 915. In a conventional art shown in FIG. 17, when the VCO 93 is powered on, the VCO gain correction section 915 applies, to the VCO 93, the control voltages of 0[V] to Vcc [V], that is, all voltages which can be applied to the VCO 93. The control voltages are sequentially applied in accordance with a value obtained by dividing, into a plurality of portions, the range of the voltages which can be applied to the VCO 93. Next, the VCO gain correction section 915 stores, in the correction table thereof, the output signals from the VCO 93 corresponding to the respective applied voltages. The curved line C4 shown in FIG. 19 represents the measured f-V characteristic of the VCO 93.

When the storage of the control voltages and the output signals from the VCO 93 has been completed, the VCO gain correction section 915 derives an equation representing a linear characteristic so as to output the corrected signal. The equation is derived based on equation (1).

$$f = A \times V + B \quad (1)$$

where f represents a VCO output frequency [Hz], V represents a VCO control terminal voltage [V], and each of A and B is a constant.

The VCO gain correction section 915 solves simultaneous equations so as to derive the equation representing the linear characteristic. The simultaneous equations consist of an equation obtained by substituting, into equation 1, a VCO oscillation frequency obtained when the VCO control terminal voltage is 0 [V], and an equation obtained by substituting, into equation 1, the VCO oscillation frequency obtained when the VCO control terminal voltage is Vcc[V].

The VCO gain correction section 915 solves the obtained two equations as simultaneous equations so as to calculate the constants represented as A and B in equation 1, thereby deriving the equation representing a linear characteristic. In FIG. 19, a curved line S4 represents a control voltage, a curved line S5 represents a desired frequency signal that corresponds to curved line S4, and a straight line C3 represents the linear characteristic obtained from the derived equation. When the FM modulation is started, the VCO gain correction section 915 starts the correction operation. At this time, a voltage represented as V2 is applied to the VCO, and the VCO gain correction section 915 substitutes the voltage V2 into equation 1 having constant A and B having been calculated, thereby obtaining a frequency f2 to be outputted by the VCO 93. Next, the VCO gain correction section 915 finds the control voltage V1 corresponding to the frequency f2 using the curved line C4 shown in FIG. 19 representing the measured f-V characteristic of the VCO 93, thereby applying the control voltage V1 to the VCO 93. Through the aforementioned operation, the VCO 93 is capable of performing an output equivalent to that performed by a VCO having a linear f-V characteristic.

The aforementioned method in which a characteristic of a voltage controlled oscillator is measured when the voltage controlled oscillator is powered on, and the correction table is created based on the characteristic having been measured, and an output from the voltage controlled oscillator is corrected using the created correction table, is disclosed in Japanese Laid-Open Patent Publication No. 10-115677 and Japanese Laid-Open Utility Model Publication No. 5-25810.

However, in a conventional art, when the VCO 93 is powered on, the control voltages corresponding to all the voltages which can be applied to the VCO 93 are applied to the VCO 93 so as to measure the f-V characteristic of the VCO 93. Therefore, the f-V characteristic is measured over a wide voltage range, so that a time period required for measuring the characteristic is extended.

SUMMARY OF THE INVENTION

Therefore, an object of the present invention is to provide an FM modulator capable of measuring the f-V characteristic in a reduced time period.

In order to attain the aforementioned object, the present invention has the following features. The present invention is directed to an FM modulator for FM-modulating a signal containing a modulation component and outputting, as an output signal, a signal having been FM-modulated, and the FM modulator comprises: a reference signal generator for generating a reference signal; a voltage controlled oscillator for outputting, as the output signal, a signal in accordance with a control voltage being applied thereto; and a control circuit for converging, to a predetermined frequency, an oscillation frequency of the voltage controlled oscillator using the reference signal, and, after the oscillation frequency has been converged to the predetermined frequency, changing, in accordance with the signal containing the modulation component, the control voltage to be applied to the voltage controlled oscillator, and causing the voltage controlled oscillator to output the output signal having been FM-modulated, and in the FM modulator, the control circuit includes a correction section for measuring, using the oscillation frequency of the voltage controlled oscillator and the control voltage to be applied to the voltage controlled oscillator, an f-V characteristic representing a relationship between the oscillation frequency and the control voltage, and applying, to the voltage controlled oscillator, the control voltage having been corrected in accordance with the f-V characteristic having been measured, and the correction section measures the f-V characteristic while the oscillation frequency is being converged to the predetermined frequency, and applies, to the voltage controlled oscillator, the control voltage having been corrected in accordance with the f-V characteristic having been measured such that the voltage controlled oscillator outputs a signal equivalent to a signal outputted by a voltage controlled oscillator having a linear f-V characteristic.

Therefore, the FM modulator according to the present invention measures the f-V characteristic of the voltage controlled oscillator while the oscillation frequency is being converged to the predetermined frequency, thereby performing the f-V characteristic measurement in a reduced time period. Further, the f-V characteristic is measured only in a range of frequencies used for the FM modulation, thereby reducing a capacity of memory for the correction section.

Preferably, a characteristic measurement time control section for notifying the correction section of a time at which the f-V characteristic is to be measured may be further provided.

Therefore, the correction section can measure the f-V characteristic of the voltage controlled oscillator when the correction section is notified, by the characteristic measurement time control section, of a time at which the f-V characteristic is to be measured. Thus, the processing performed by the control circuit can be reduced as compared to a case where the correction section itself determines the time at which the f-V characteristic of the voltage controlled oscillator is to be measured.

Preferably, the control circuit may converge the oscillation frequency to the predetermined frequency by performing a digital process.

Therefore, a computer can be used for the control circuit so as to easily set the time at which the correction section measures the f-V characteristic of the voltage controlled oscillator.

Preferably, the control circuit may converge the oscillation frequency to the predetermined frequency by performing an analog process.

Therefore, a converter, such as a DAC (digital-analog converter) and an ADC (Analog-Digital Converter), for converting a digital signal into an analog signal and vice versa, may be eliminated from the control circuit, whereby the FM modulator can be fabricated using widely available analog circuits.

A phase locked loop circuit, including the control circuit and the voltage controlled oscillator, may perform a process of converging the oscillation frequency to the predetermined frequency utilizing a first time period and a second time period, and the first time period represents a time period from a start of the process to a time at which the oscillation frequency reaches a predetermined frequency range including the predetermined frequency, and the second time period represents a time period from the time at which the oscillation frequency reaches the predetermined frequency range including the predetermined frequency to a time at which the oscillation frequency is locked, and the correction section may measure the f-V characteristic in an arbitrary time period included in the first time period.

Therefore, the control voltage necessary for measuring the f-V characteristic can be spontaneously obtained in the first time period, thereby measuring the f-V characteristic in a reduced time period utilizing a time period in which the PLL circuit converges the oscillation frequency to the predetermined frequency.

Preferably, the correction section may start measuring the f-V characteristic at a beginning of the first time period, and may end measuring the f-V characteristic at an end of the first time period.

Therefore, the correction section can measure the f-V characteristic of the voltage controlled oscillator throughout the first time period, thereby measuring the f-V characteristic with enhanced accuracy.

Preferably, a phase of the oscillation frequency is repeatedly inverted in the first time period using the predetermined frequency as a reference until the oscillation frequency reaches the predetermined frequency range, and the correction section may measure the f-V characteristic from an inflection point of the oscillation frequency to an immediately following inflection point of the oscillation frequency.

Therefore, the correction section can utilize a characteristic of the inflection points which always appear while the oscillation frequency of the voltage controlled oscillator is being converged to the predetermined frequency, thereby reducing the time period in which the f-V characteristic is measured.

Preferably, a phase of the oscillation frequency is repeatedly inverted in the first time period using the predetermined frequency as a reference until the oscillation frequency reaches the predetermined frequency range, and the correction section may measure the f-V characteristic from a time at which the phase of the oscillation frequency is inverted to a time at which the phase of the oscillation frequency is inverted for a second time after the time at which the phase of the oscillation frequency is inverted.

Therefore, the correction section can utilize a characteristic, that the phase of the oscillation frequency is inverted, which always appears while the oscillation frequency of the voltage controlled oscillator is being converged to the predetermined frequency, thereby reducing the time period in which the f-V characteristic is measured.

A phase locked loop circuit, including the control circuit and the voltage controlled oscillator, may perform a process of converging the oscillation frequency to the predetermined frequency utilizing a first time period and a second time period, and the first time period represents a time period from a start of the process to a time at which the oscillation frequency reaches a predetermined frequency range including the predetermined frequency, and the second time period represents a time period from the time at which the oscillation frequency reaches the predetermined frequency range including the predetermined frequency to a time at which the oscillation frequency is locked, and the correction section may measure, in an arbitrary time period included in the second time period, the f-V characteristic necessary for performing an FM-modulation using the predetermined frequency by changing the control voltage to be applied to the voltage controlled oscillator.

Therefore, the correction section measures the f-V characteristic only in a range of frequencies required for the FM modulation using the predetermined frequency, thereby reducing the time period necessary for the measurement and reducing an amount of data, representing the f-V characteristic, to be stored in the correction section.

Preferably, the correction section may start to measure the f-V characteristic at a beginning of the second time period, and, when the f-V characteristic necessary for performing the FM modulation using the predetermined frequency has been measured, may stop changing (correcting) the control voltage.

Therefore, the correction section can automatically end the measurement of the f-V characteristic when the correction section has measured the f-V characteristic necessary for the FM modulation using the predetermined frequency, thereby eliminating an operation for determining whether or not a condition for ending the measurement is satisfied.

Preferably, the correction section may measure the f-V characteristic after a channel outputted by the voltage controlled oscillator is changed.

Therefore, the correction section can measure the f-V characteristic of the voltage controlled oscillator in any time period from the channel change to the time at which the oscillation frequency spontaneously reaches the predetermined frequency.

Preferably, the correction section may measure the f-V characteristic after the FM modulator has been powered on.

Therefore, the correction section can measure the f-V characteristic of the voltage controlled oscillator, after the FM modulator has been powered on, in any time period from the channel change to the time at which the oscillation frequency spontaneously reaches the predetermined frequency.

The present invention is directed to a wireless device for transmitting an FM-modulated radio signal, which comprises an FM modulator for FM-modulating a signal containing a modulation component and outputting, as an output signal, a signal having been FM-modulated, and in the wireless device, the FM-modulator includes: a reference signal generator for generating a reference signal; a voltage controlled oscillator for outputting, as the output signal, a signal in accordance with a control voltage being applied thereto; and a control circuit for converging, to a predetermined frequency, an oscillation frequency of the voltage controlled oscillator using the reference signal, and, after the oscillation frequency has been converged to the predetermined frequency, changing, in accordance with the signal containing the modulation component, the control voltage to be applied to the voltage controlled oscillator, and causing the voltage controlled oscillator to output the output signal having been FM-modulated, and the control circuit includes a correction section for measuring, using the oscillation frequency of the voltage controlled oscillator and the control voltage to be applied to the voltage controlled oscillator, an f-V characteristic representing a relationship between the oscillation frequency and the control voltage, and applying, to the voltage controlled oscillator, the control voltage having been corrected in accordance with the f-V characteristic having been measured, and the correction section measures the f-V characteristic while the oscillation frequency is being converged to the predetermined frequency, and applies, to the voltage controlled oscillator, the control voltage having been corrected in accordance with the f-V characteristic having been measured such that the voltage controlled oscillator outputs a signal equivalent to a signal outputted by a voltage controlled oscillator having a linear f-V characteristic.

Therefore, the wireless device including the FM modulator according to the present invention can reduce a time period from a channel change to a start of the FM modulation after the FM modulator is powered on.

As described above, the FM modulator according to the present invention measures the f-V characteristic of the voltage controlled oscillator while the oscillation frequency is being converged to the predetermined frequency, thereby performing the f-V characteristic measurement in a reduced time period. Further, the f-V characteristic is measured only in a range of frequencies used for the FM modulation, thereby reducing a capacity of memory for the correction section.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 shows an exemplary memory structure of the correction table stored in a correction section 108 shown in FIG. 2, a correction section 108a shown in FIG. 9, a VCO gain correction section 204 shown in FIG. 12, and a VCO gain correction section 204a shown in FIG. 15;

DETAILED DESCRIPTION OF THE INVENTION

First Embodiment

Figure 1:
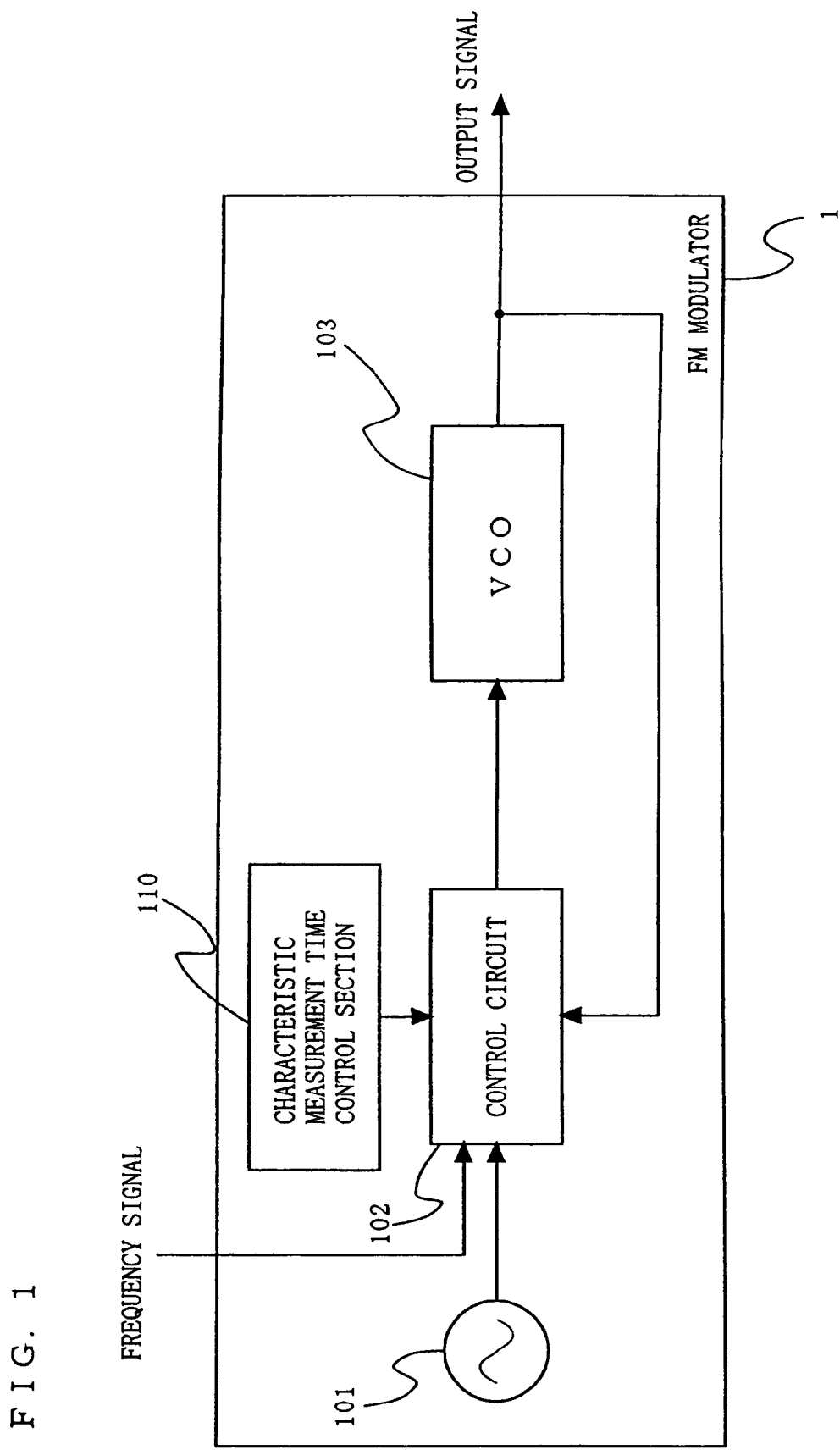
FIG. 1 is a schematic block diagram illustrating a structure of an FM modulator 1 according to a first embodiment of the present invention.

Hereinafter, a first embodiment of the present invention will be described with reference to the drawings. FIG. 1 is a schematic diagram illustrating a structure of an FM modulator 1 according to a first embodiment of the present invention. As shown in FIG. 1, the FM modulator 1 comprises: a reference signal generator 101; a control circuit 102; a voltage controlled oscillator 103 (hereinafter, referred to as a VCO 103); and a characteristic measurement time control section 110.

The reference signal generator 101 generates a reference signal. The reference signal having been generated is multiplied by a frequency signal inputted to the FM modulator 1 from outside thereof so as to be used for an FM modulation and for generation of a clock signal required for an operation performed by the control circuit 102 configured as a digital circuit. The frequency signal inputted to the FM modulator 1 from outside thereof contains a modulation signal, and channel data representing a desired frequency of a carrier wave used for the FM modulation.

The control circuit 102 multiplies, by the frequency signal inputted to the FM modulator 1 from outside thereof, the reference signal generated by the reference signal generator 101. The control circuit 102 compares a phase of the signal obtained through the multiplication with a phase of an output signal from the VCO 103 so as to synchronize the phase of the signal obtained through the multiplication and the phase of the output signal from the VCO 103.

The VCO 103 outputs an output signal having an oscillation frequency corresponding to a control voltage applied to a VCO control terminal thereof. An analog voltage outputted by the control circuit 102 is applied to the VCO control terminal.

The characteristic measurement time control section 110 notifies the control circuit 102 of a time at which a correction value for the control voltage applied to the VCO 103 is to be calculated. The control circuit 102 calculates the correction value for the control voltage at the time indicated by the characteristic measurement time control section 110, and corrects, using the correction value, the control voltage to be applied to the VCO 103.

Hereinafter, the structure of the FM modulator will be described in detail.

Figure 2:
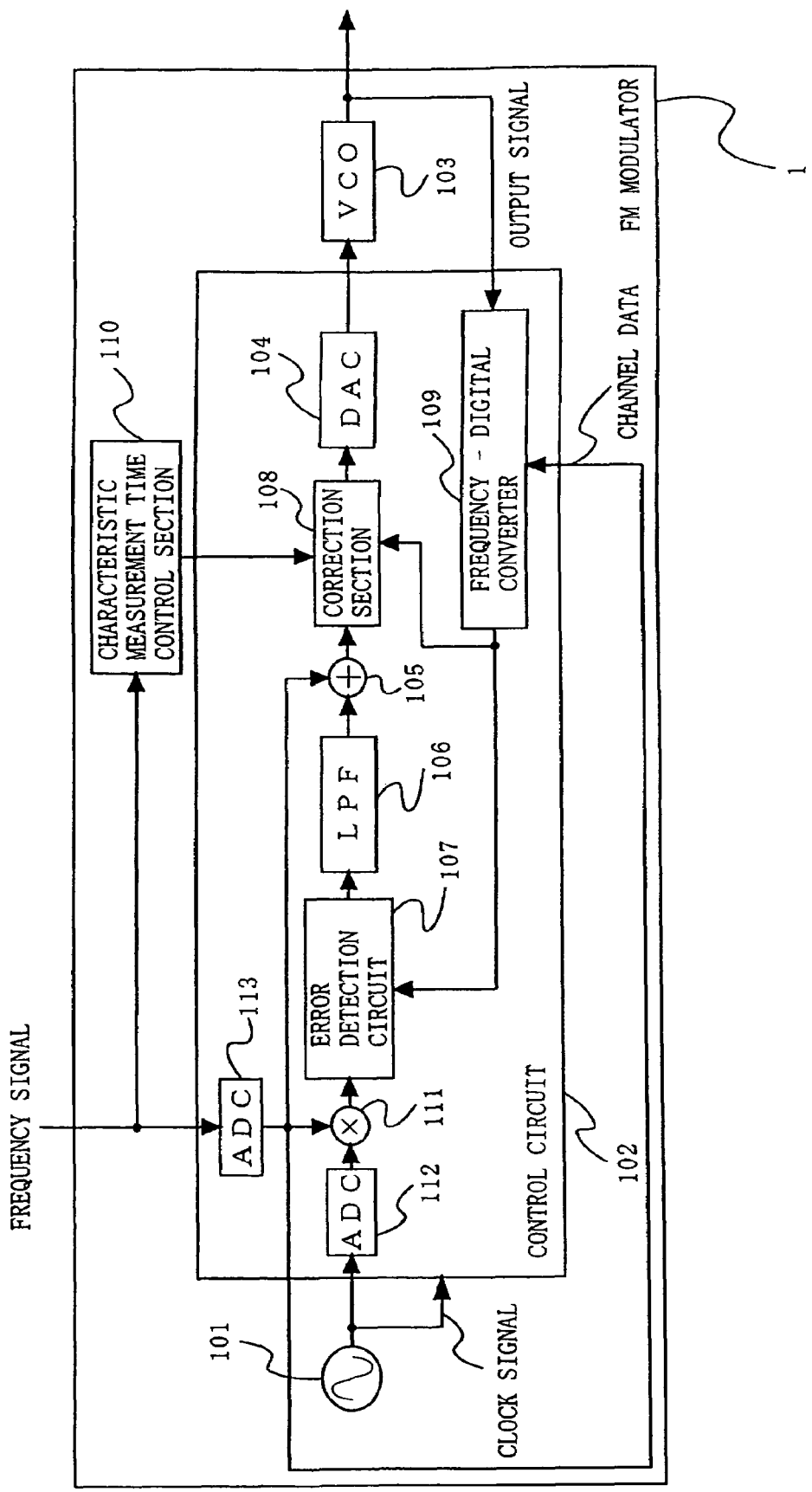
FIG. 2 is a block diagram illustrating in detail the structure of the FM modulator 1 according to the first embodiment of the present invention.
Figure 17:
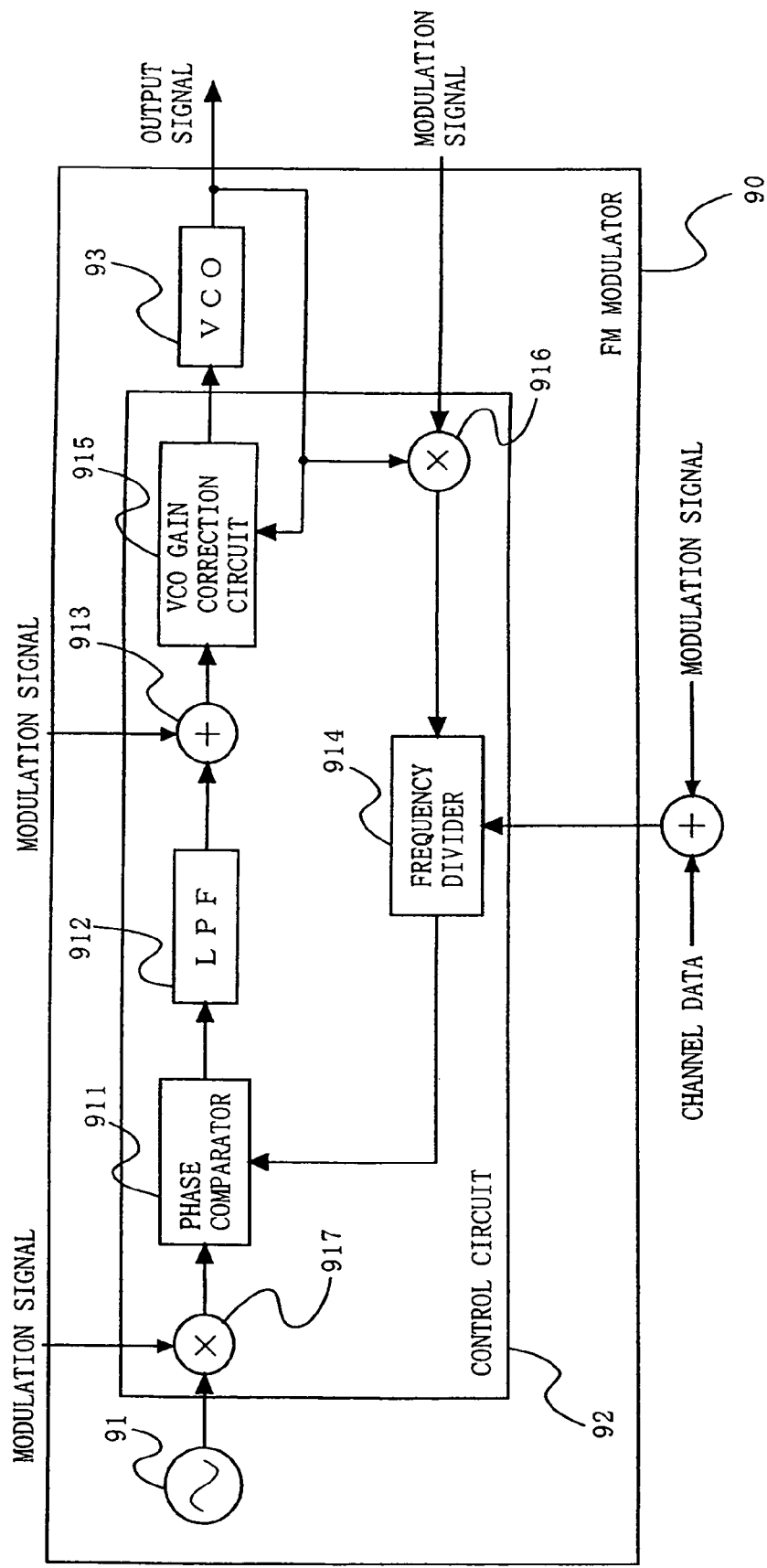
FIG. 17 is a block diagram illustrating a structure of a conventional FM modulator 90.
Figure 18:
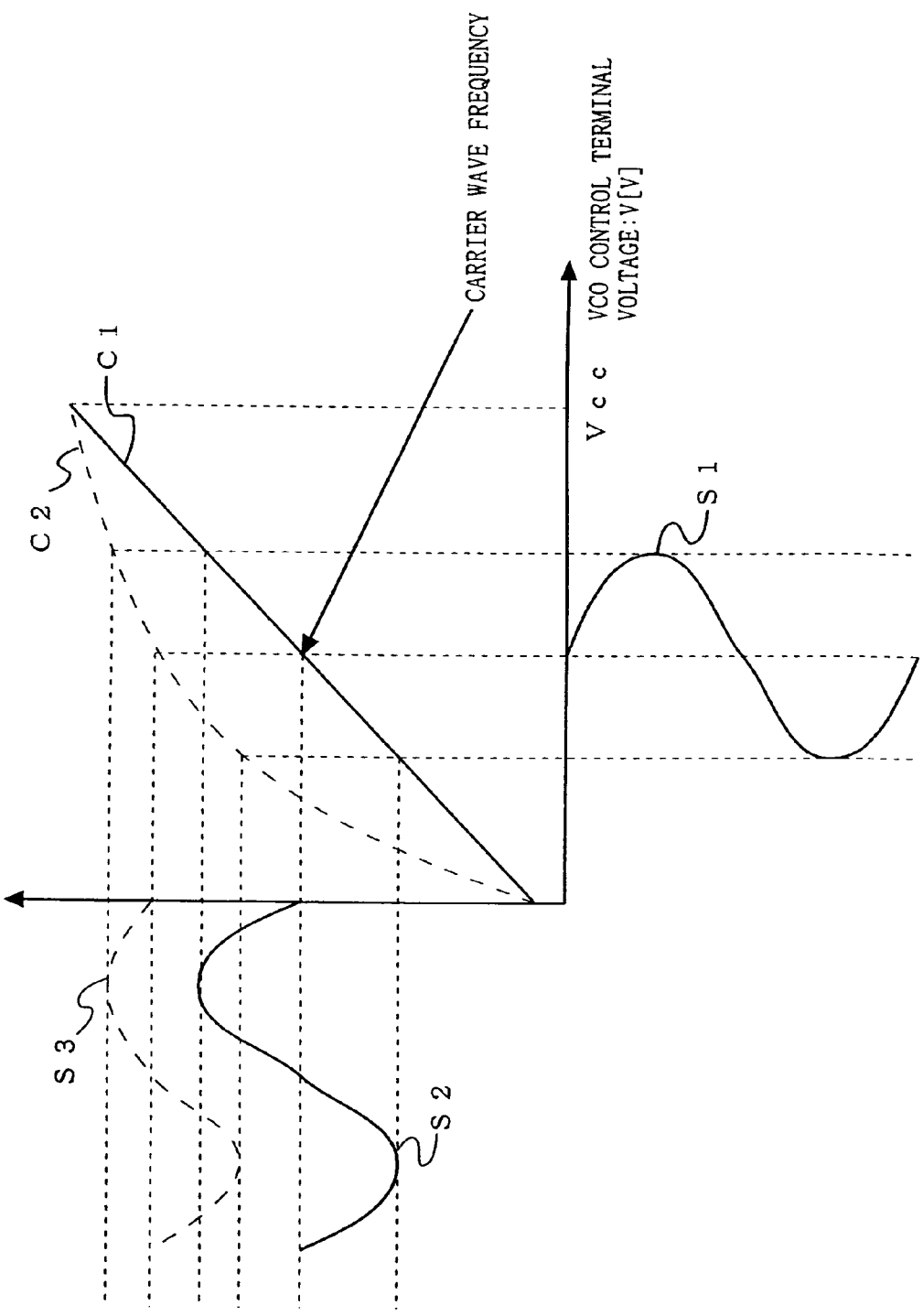
FIG. 18 is a diagram illustrating a principle of an operation performed by a voltage controlled oscillator (VCO)
Figure 19:
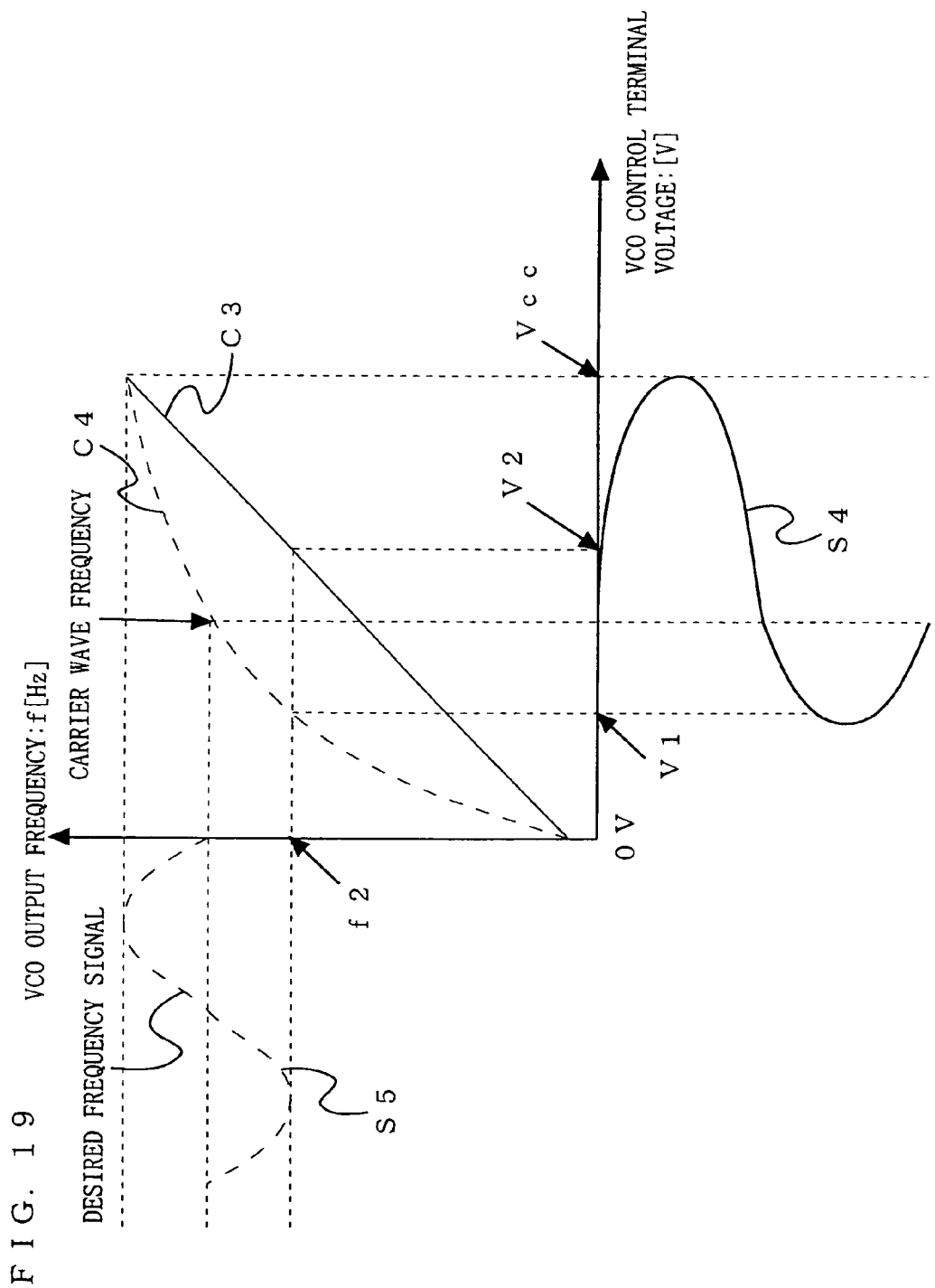
FIG. 19 is a diagram illustrating a method for correcting a nonlinear characteristic of a VCO using a conventional art.

FIG. 2 is a block diagram illustrating in detail the structure of the FM modulator 1 according to a first embodiment of the present invention. As shown in FIG. 2, the control circuit 102 includes: a digital-analog converter 104 (hereinafter, referred to as a DAC 104); an adder 105; a low pass filter 106 (hereinafter, referred to as an LPF 106); an error detection circuit 107; a correction section 108; a frequency-digital converter 109; a multiplier 111; and analog-digital converters 112, 113 (hereinafter, referred to an ADC 112 and an ADC 113, respectively). In the control circuit 92 of the conventional FM modulator 90 shown in FIG. 17, components other than the VCO gain correction section 915 are configured as analog circuits. However, in the control circuit 102 according to the first embodiment of the present invention, all the components of the control circuit 102 are configured as digital circuits. The control circuit 102 according to the first embodiment of the present invention is substantially different from the control circuit 92 of the conventional FM modulator 90 in this point. Therefore, the clock signal is required for the operation performed by the control circuit 102 shown in FIG. 2. As the clock signal required for the operation performed by the control circuit 102, the signal generated by the reference signal generator 101 may be used as it is, or a signal generated based on the reference signal generated by the reference signal generator 101 may be used.

The VCO 103 outputs the output signal of a frequency corresponding to the control voltage applied to the VCO control terminal included in the VCO 103.

The frequency-digital converter 109 converts a frequency of the output signal outputted by the VCO 103 so as to have a digital value, and supplies the digital value to the correction section 108 and the error detection circuit 107. Specifically, the frequency-digital converter 109 inputs, into a counter included therein, the output signal from the VCO 103 during a certain time period, and causes the counter to count the number of times the output signal from the VCO 103 has a peak value, thereby outputting a digital value representing a value having been obtained through the counting. The certain time period is preset in the frequency-digital converter 109. For example, when the value representing the number of times having been counted by the frequency-digital converter 109 in one msec is 100,000, the digital value of the frequency is obtained as 100,000÷1 msec=100 MHz. Using the calculation method, the output signal from the VCO 103 is converted into a digital value. This conversion is described in detail in "A Digitally Controlled PLL for SoC Applications", written by Haruhiko Ichino, Satomi Kusanagi, Kyoko Fujimoto, Keiji Kishine, in IEEE JOURNAL OF SOLID-STATE CIRCUITS, Volume 39, Issue 5, May 2004, p. 751.

Further, the frequency-digital converter 109 changes, based on the channel data contained in the frequency signal inputted to the FM modulator 1 from outside thereof, a frequency dividing ratio used in a frequency divider included in the frequency-digital converter 109. A desired frequency is obtained as a product of the frequency dividing ratio and a frequency of the reference signal generated by the reference signal generator 101.

The ADC 112 converts the frequency of the reference signal generated by the reference signal generator 101 so as to have a digital value, and supplies the digital value to the multiplier 111.

The ADC 113 converts the frequency signal, which is inputted to the FM modulator 1 from outside thereof and contains the channel data and the modulation signal as components of the frequency signal, so as to have a digital value, and supplies the digital value to the multiplier 111, the adder 105, and the frequency-digital converter 109.

The multiplier 111 multiplies an output value from the ADC 112 by an output value from the ADC 113.

The error detection circuit 107 receives an output signal from the multiplier 111 and an output signal from the frequency-digital converter 109. The error detection circuit 107 outputs a square wave corresponding to a phase difference between the signals having been received. Specifically, the error detection circuit 107 performs an exclusive OR operation on a bit string outputted by the multiplier 111 and a bit string outputted by the frequency-digital converter 109, and outputs, as the square wave, the bit string obtained through the exclusive OR operation.

The LPF 106 subjects the square wave outputted by the error detection circuit 107 to filtering.

The adder 105 adds an output signal from the LPF 106 to the frequency signal which is represented as the digital value and supplied from the ADC 113. The frequency signal inputted to the control circuit 102 from outside thereof contains the modulation component. The frequency signal directly inputted to the adder 105, which is not subjected to the filtering by the LPF 106, contains a high frequency component, thereby obtaining a high frequency modulation characteristic of the FM modulator 1.

The characteristic measurement time control section 110 monitors the channel data contained in the frequency signal inputted to the FM modulator 1 from outside thereof. The characteristic measurement time control section 110 detects for a change of the channel data so as to determine times at which the FM modulation is to be started and ended, and times at which a measurement of an f-V characteristic of the VCO 103 is to be started and ended, and notifies the correction section 108 of the times.

Figure 3:
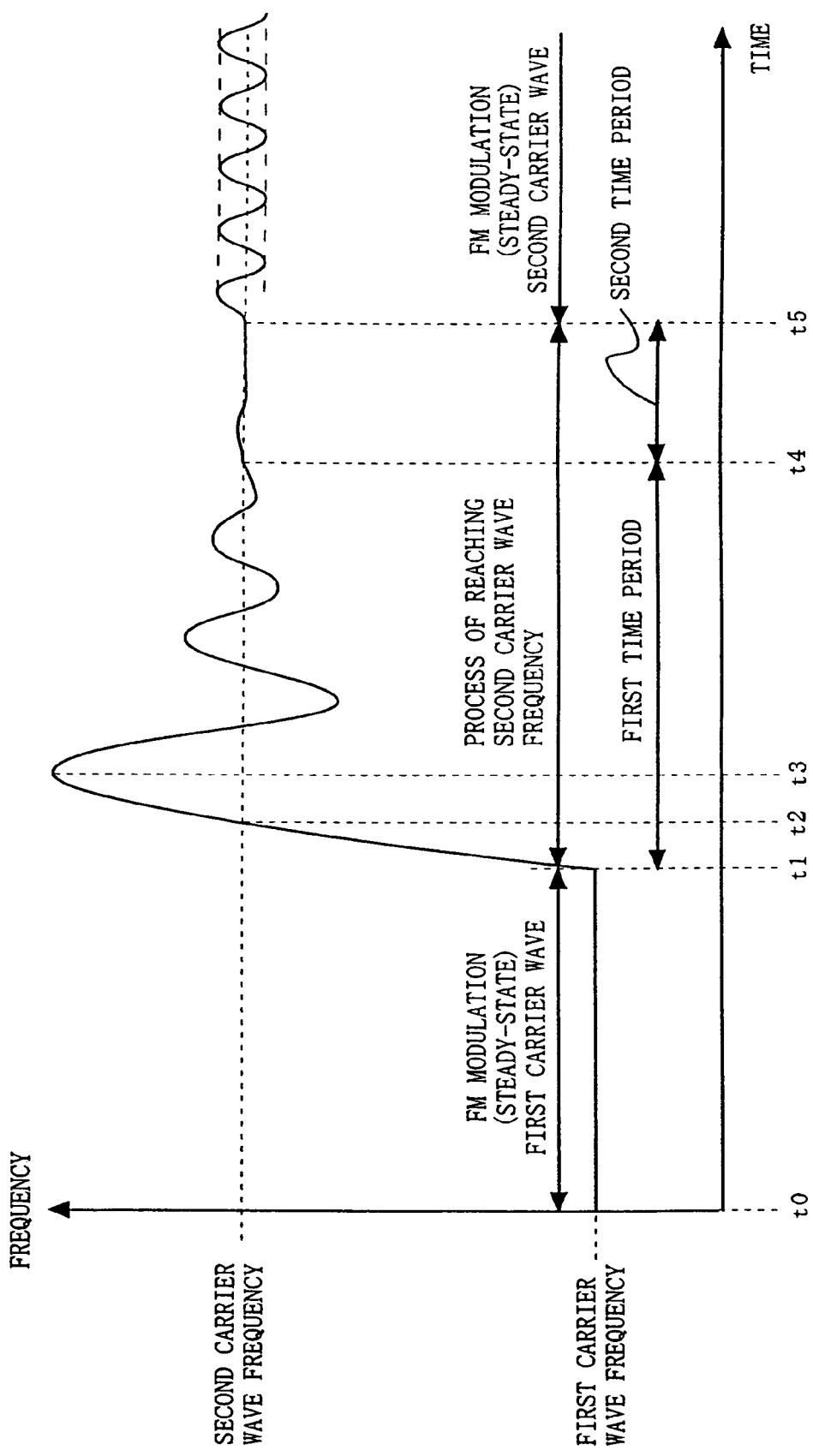
FIG. 3 is a diagram illustrating times at which a correction section performs operations according to the present invention.

FIG. 3 is a diagram illustrating times at which the correction section 108 performs operations according to the present invention. When the FM modulator 1 shown in FIG. 2 is used for a radio communication system, a carrier wave frequency is not constant, that is, a carrier wave frequency can be changed. FIG. 3 shows an example where a first carrier wave frequency is changed to a second carrier wave frequency corresponding to a desired frequency as time passes. In FIG. 3, in a time period from t0 to t1, a first carrier wave is in a steady state in the control circuit 102, i.e., a digital PLL circuit. For example, in FIG. 3, the first carrier wave frequency starts to change to the second carrier wave frequency at time t1, and a sine wave having the second carrier wave frequency starts to be modulated at time t5.

In FIG. 3, at time t1, the channel data is changed, and the carrier wave frequency starts to change to the second carrier wave frequency after the FM modulation using the first carrier wave frequency is ended. At time t2, the carrier wave frequency reaches the desired frequency immediately after the carrier wave frequency starts to change. At time t3, an inflection point is obtained at which a value obtained by differentiating the carrier wave frequency with respect to time becomes zero. At time t4, the carrier wave frequency reaches a predetermined frequency range including the desired frequency. At time t5, the FM modulation using the desired frequency is started.

Time t1 shown in FIG. 3 is detected by the characteristic measurement time control section 110 when the channel data inputted to the FM modulator 1 from outside thereof is changed. Times t2, t3, t4, and t5 are preset in the characteristic measurement time control section 110.

In the first embodiment, the time, determined by the characteristic measurement time control section 110, at which the f-V characteristic measurement is to be started is time t1 at which the channel data is changed and the carrier wave frequency starts to change. Further, in the first embodiment, the time, determined by the characteristic measurement time control section 110, at which the f-V characteristic measurement is to be ended is time t4 at which the carrier wave frequency reaches the predetermined frequency range including the desired frequency. A time period from time t1 to time t4 is referred to as a first time period.

In the first embodiment, the time at which the f-V characteristic measurement of the VCO 103 is to be started and the time at which the f-V characteristic measurement of the VCO 103 is to be ended are not restricted thereto. Other times can be also used. Examples of the other times will be described below.

FIG. 4 is a diagram illustrating an exemplary structure of the correction table stored in the correction section 108. When the correction section 108 is notified, by the characteristic measurement time control section 110, of the time at which the f-V characteristic measurement is to be started, the correction section 108 starts to store, in the correction table shown in FIG. 4, input values to the DAC 104 associated with output signals from the frequency-digital converter 109, respectively.

After the carrier wave frequency starts to change at time t1, at time t4 at which the carrier wave frequency reaches the predetermined frequency range including the desired frequency, the characteristic measurement time control section 110 notifies the correction section 108 of the time at which the f-V characteristic measurement is to be ended. When the correction section 108 is notified, by the characteristic measurement time control section 110, of the time at which the f-V characteristic measurement is to be ended, the correction section 108 stops storing the input values to the DAC 104, and the output signals from the frequency-digital converter 109.

When the correction section 108 ends the measurement of the f-V characteristic of the VCO 103, the correction section 108 derives an equation representing a favorable linear characteristic of the VCO 103 based on the input values to the DAC 104 and the output signals from the frequency-digital converter 109, both of which have been stored therein.

After the carrier wave frequency has been changed to the desired frequency, at time t5 at which the FM modulation using the desired frequency is to be started, the characteristic measurement time control section 110 notifies the correction section 108 of a time at which the correction is to be started.

When the correction section 108 is notified, by the characteristic measurement time control section 110, of the time at which the correction is to be started, the correction section 108 calculates a frequency of the output signal from the VCO 103 based on a signal received from the adder 105 using the derived equation. The correction section 108 searches the correction table for a value corresponding to the calculated frequency, and outputs, to the DAC 104, the value as a correction value represented as a digital value. Thus, the correction section 108 is capable of correcting the output from the VCO 103.

In a time period from the start of the change from the first carrier wave frequency to the desired frequency, to the start of the FM modulation using the desired frequency, the correction section 108 outputs the input signals from the adder 105 directly to the DAC 104. This is because, when the correction section 108 does not output, to the VCO 103, a phase difference signal detected by the error detection circuit 107, the carrier wave frequency does not reach the desired frequency.

The DAC 104 converts the correction value received from the correction section 108 into an analog control voltage using, for example, a zero-order hold, and outputs the analog control voltage. The control voltage outputted by the DAC 104 is applied to the VCO control terminal of the VCO 103.

As described above, when the FM modulator 1 is constructed as shown in FIG. 2, the control circuit 102 is capable of acquiring the output signal from the VCO 103 as a digital value through the frequency-digital converter 109. The acquired digital value and the output signal from the multiplier 111 are supplied to the error detection circuit 107. The error detection circuit 107 detects for a phase difference between the signal outputted by the multiplier 111 and the signal outputted by the frequency-digital converter 109, and outputs a square wave corresponding to the phase difference having been detected. The LPF 106 outputs a DC value corresponding to the output signal from the error detection circuit 107. The DC value corresponding to the phase difference is supplied from the LPF 106 to the correction section 108. The correction section 108 outputs, to the DAC 104, the correction value having been calculated, as a digital value, based on the input signal from the adder 105 at a time indicated by the characteristic measurement time control section 110. The DAC 104 converts the digital value received from the correction section 108 into an analog voltage, and applies the analog voltage to the VCO 103. By repeating the aforementioned operation, the phase difference detected by the error detection circuit 107 is reduced so as to synchronize the phase of the output signal supplied from the multiplier 111 to the error detection circuit 107 and the phase of the output signal from the VCO 103.

Figure 5:
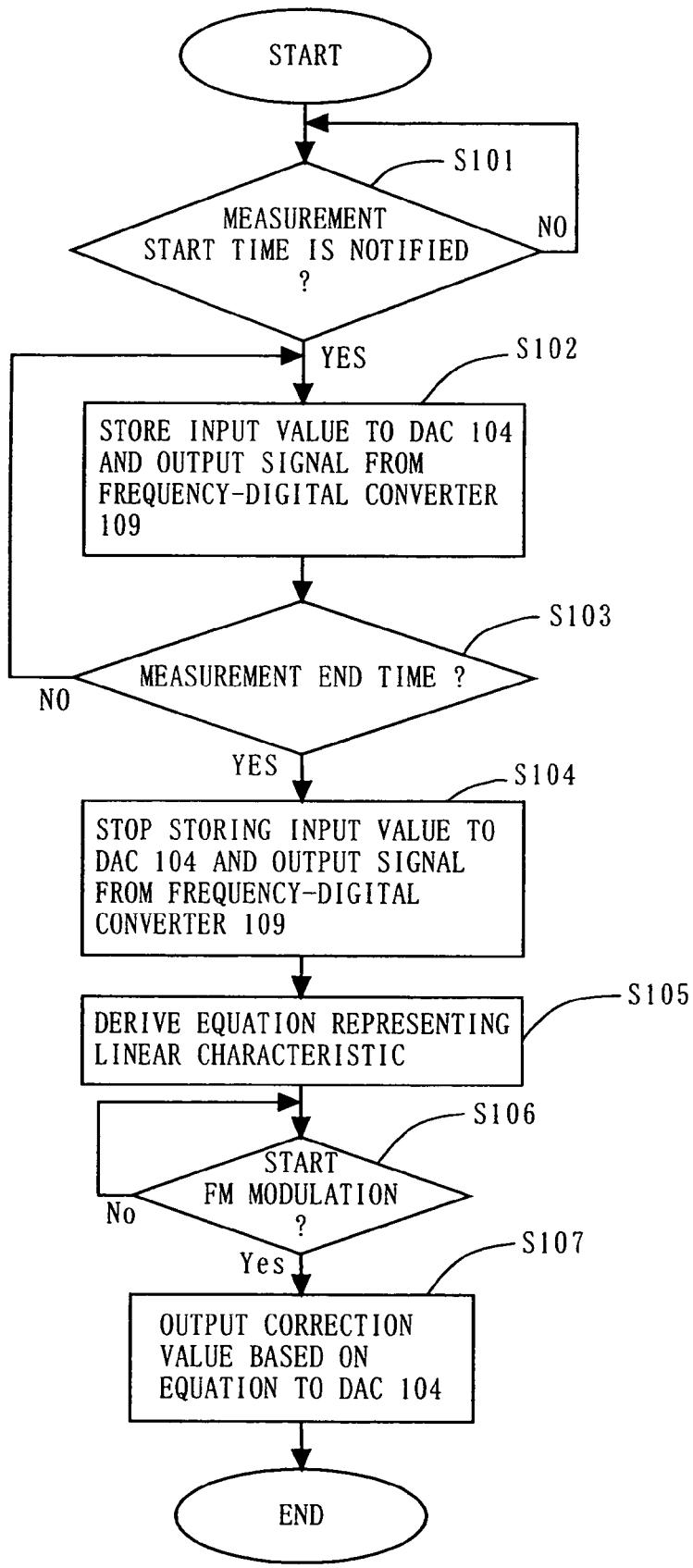
FIG. 5 is a flow chart of an operation performed by the correction section 108 according to the first embodiment of the present invention.

FIG. 5 is a flow chart of the operation performed by the correction section 108. Hereinafter, with reference to FIGS. 2, 4, and 5, the operation performed by the correction section 108 according to the first embodiment of the present invention will be described in detail.

With reference to FIG. 5, at time t1 at which the carrier wave frequency starts to change, the characteristic measurement time control section 110 detects for a change of the channel data. When the change of the channel data is detected, the characteristic measurement time control section 110 notifies the correction section 108 of the time at which the f-V characteristic measurement is to be started. The correction section 108 determines in step S101 whether or not the correction section 108 has been notified, by the characteristic measurement time control section 110, of the time at which the f-V characteristic measurement is to be started. When the correction section 108 has been notified of the time at which the f-V characteristic measurement is to be started, the process advances to step S102. On the other hand, when the correction section 108 has not been notified of the time at which the f-V characteristic measurement is to be started, the process is returned to step S101.

In step S102, the correction section 108 stores the input values to the DAC 104 and the output signals from the frequency-digital converter 109. The correction section 108 determines in step S103 whether or not the correction section 108 has been notified, by the characteristic measurement time control section 110, of the time at which the f-V characteristic measurement is to be ended. When the correction section 108 has been notified of the time at which the f-V characteristic measurement is to be ended, the process advances to step S104. On the other hand, when the correction section 108 has not been notified of the time at which the f-V characteristic measurement is to be ended, the process is returned to step S102.

In step S104, the measurement of the f-V characteristic of the VCO 103 is ended.

Next, in step S105, the correction section 108 derives an equation representing a linear characteristic, based on the input values to the DAC 104 and the output signals from the frequency-digital converter 109, in a time period from time t4 to time t5 at which the FM modulation using the desired frequency is started.

Next, the correction section 108 determines in step S106 whether or not the correction section 108 has been notified, by the characteristic measurement time controls section 110, of a time at which the FM modulation using the desired frequency is to be started. When the correction section 108 has been notified of the time at which the FM modulation using the desired frequency is to be started, the process advances to step S107. On the other hand, when the correction section 108 has not been notified of the time at which the FM modulation using the desired frequency is to be started, the process is returned to step S106.

In step S107, the correction section 108 calculates the correction value based on the input value from the adder 105 using the equation having been derived, and outputs the correction value to the DAC 104.

Figure 6:
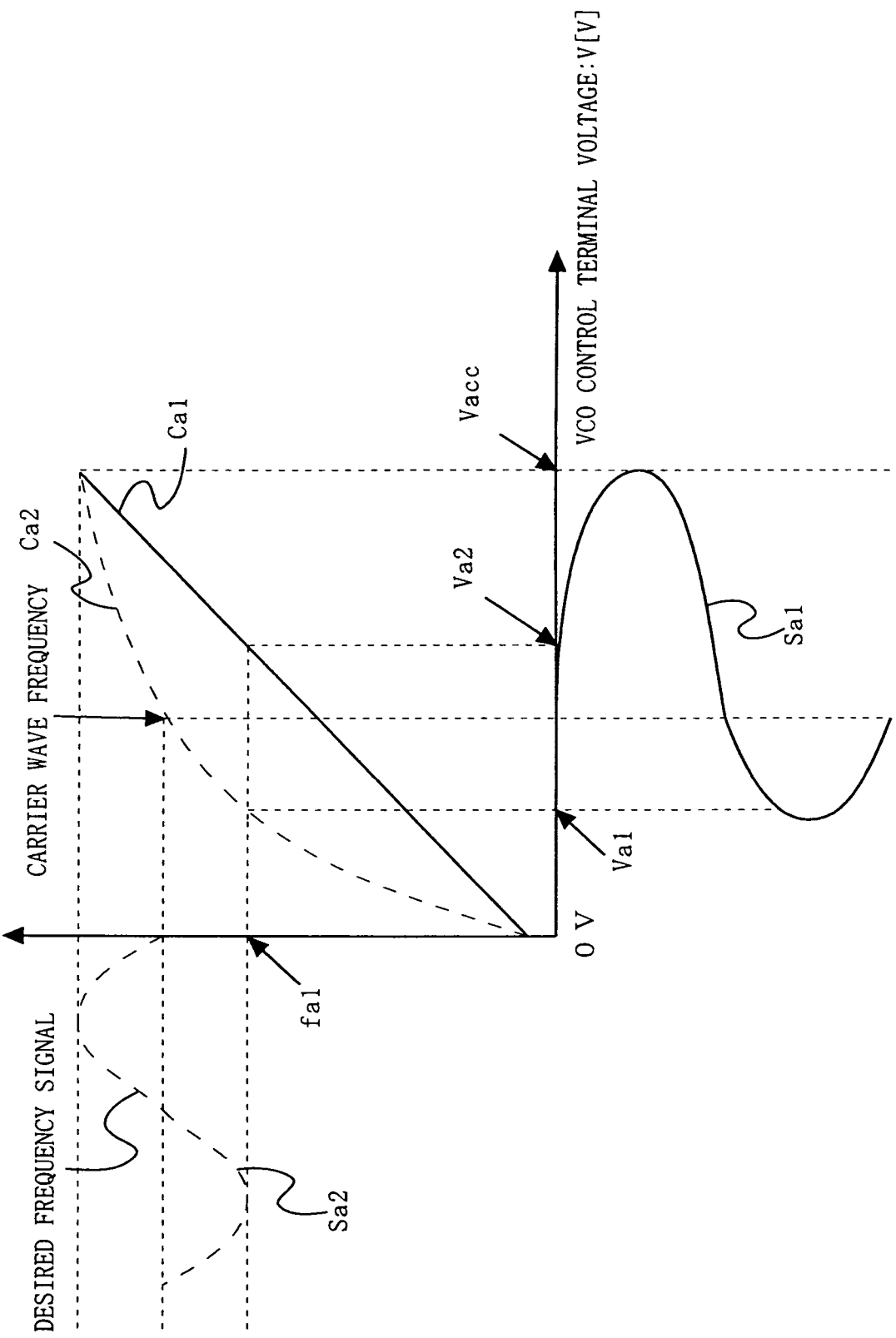
FIG. 6 is a diagram illustrating a method for correcting a nonlinear characteristic of a VCO.

FIG. 6 is a diagram illustrating a correction method performed by the correction section 108. In FIG. 6, a curved line Sa1 represents a correction signal supplied to the VCO 103. A curved line Sa2 represents a favorable output signal from the VCO 103 corresponding to the correction signal supplied to the VCO 103. A straight line Ca1 represents a favorable f-V characteristic of the VCO 103, and a curved line Ca2 represents an f-V characteristic of the VCO 103 which has been actually measured by the correction section 108.

When the correction section 108 stops storing the output signals from the frequency-digital converter 109 and the input values to the VCO 103, the correction section 108 derives an equation representing a linear characteristic so as to output the correction signal. The equation is derived based on equation (2).

$$f = A \times V + B \tag{2}$$

where f represents a VCO output frequency [Hz], V represents a VCO control terminal voltage [V], and each of A and B is a constant.

The correction section 108 solves simultaneous equations so as to derive the equation representing the linear characteristic. The simultaneous equations consist of an equation obtained by substituting, into equation 2, the output signal from the VCO 103 obtained when the VCO control terminal voltage is 0 [V], and an equation obtained by substituting, into equation 2, the output signal from the VCO 103 obtained when the VCO control terminal voltage is Vacc[V], with reference to the correction table stored in the correction section 108.

The correction section 108 solves the obtained two equations as simultaneous equations so as to calculate the constants represented as A and B in equation 2, thereby deriving the equation representing a linear characteristic. In FIG. 6, the straight line Ca1 represents the linear characteristic obtained through the equation having been derived. When the FM modulation using the desired frequency is started, the correction section 108 starts the correction operation. When a voltage represented by Va2 is applied to the VCO 103, the correction section 108 substitutes the voltage Va2 into equation 2 having its constants A and B having been calculated, thereby obtaining a frequency fa1 to be outputted by the VCO 103. Next, the correction section 108 identifies a control voltage Va1 corresponding to the frequency fa1 based on the f-V characteristic of the VCO 103 represented by the curved line Ca2 shown in FIG. 6, and applies the identified control voltage to the VCO 103. Through the aforementioned operation, the VCO 103 can make an output equivalent to that from a VCO having a linear f-V characteristic.

As described above, according to the first embodiment, the correction section 108 measures the f-V characteristic in the first time period. Accordingly, the correction section 108 measures the input value to the DAC 104 and the output signal from the frequency-digital converter 109, each of which has a value representing a frequency in a frequency range including the desired frequency as represented by a carrier wave frequency curved line in the first time period. Therefore, although in a conventional art the f-V characteristic is measured when the VCO is powered on, the correction section 108 measures the f-V characteristic of the VCO 103 while the carrier wave frequency is being changed, thereby enabling the measurement of the f-V characteristic of the VCO 103 in a reduced time period and reduction of a capacity of memory allocated to the correction table. The first time period from time t1 to t4 as shown in FIG. 3 is a time period indispensable to the locking of the PLL circuit. Therefore, in the first embodiment of the present invention, a time period, which has not been used in a conventional art, can be effectively utilized.

Further, the f-V characteristic of the VCO 103 is changed depending on a temperature and a reduction in power supply voltage. When the first embodiment of the present invention is used in a wireless system, a power amplifier which generates a large amount of heat when mounted in a substantially small device and the VCO 103 are mounted on the same substrate. Therefore, an error may occur in the correction signal outputted by the correction section 108 while the FM modulator 1 is being operated. However, according to the present invention, the correction section 108 measures the f-V characteristic of the VCO 103 each time the carrier wave frequency is changed. Therefore, according to the present invention, it is possible to suppress the error in the correction signal occurring due to the change of the f-V characteristic of the VCO 103 which is caused by the temperature change and the reduction in power supply voltage while the FM modulator 1 is being operated.

Although in the first embodiment the correction section 108 starts to measure the f-V characteristic of the VCO 103 at time t1 shown in FIG. 3, the correction section 108 may start to measure the f-V characteristic of the VCO 103 at another time. For example, when the VCO 103 is powered on, the correction section 108 may start to measure the f-V characteristic of the VCO 103. In this case, the VCO 103 is powered on at time t1 as shown in FIG. 3, and the process of the carrier wave frequency reaching the predetermined frequency range after the VCO 103 is powered on is the same as the process after time t1 shown in FIG. 3.

Although in the first embodiment the correction section 108 starts to measure the f-V characteristic of the VCO 103 at time t1 shown in FIG. 3, the correction section 108 may start to measure the f-V characteristic of the VCO 103 at another time. For example, at a time, represented by, for example, time t2 in the first time period shown in FIG. 3, at which a phase of the carrier wave frequency is inverted, the correction section 108 may start to measure the f-V characteristic of the VCO 103. In this case, at time t2, the characteristic measurement time control section 110 notifies the correction section 108 of the time at which the measurement of the f-V characteristic of the VCO 103 is to be started. The characteristic measurement time control section 110 notifies the correction section 108 of the time at which the f-V characteristic measurement is to be ended at a time (not shown) at which the phase of the carrier wave frequency is inverted for the second time after the measurement of the f-V characteristic has been started. The time, at which the phase of the carrier wave frequency is inverted for the second time after the measurement of the f-V characteristic has been started, is preset in the characteristic measurement time control section 110. Also in this method, the correction section 108 can measure the f-V characteristic of the VCO 103.

Although in the first embodiment the correction section 108 starts to measure the f-V characteristic of the VCO 103 at time t1 shown in FIG. 3, the correction section 108 may start to measure the f-V characteristic of the VCO 103 at another time. For example, the correction section 108 may start to measure the f-V characteristic of the VCO 103 at an inflection point of the carrier wave frequency represented by, for example, time t3 in the first time period shown in FIG. 3. In this case, at time t3, the characteristic measurement time control section 110 notifies the correction section 108 of the time at which the measurement of the f-V characteristic of the VCO 103 is to be started. The characteristic measurement time control section 110 notifies the correction section 108 of the time at which the f-V characteristic measurement is to be ended at an inflection point (not shown) obtained immediately after the measurement of the f-V characteristic has been started. The inflection point obtained immediately after the measurement of the f-V characteristic has been started is preset in the characteristic measurement time control section 110. Also in this method, the correction section 108 can measure the f-V characteristic of the VCO 103.

Although in the first embodiment the correction section 108 starts to measure the f-V characteristic of the VCO 103 at time t1 shown in FIG. 3, the correction section 108 may start to measure the f-V characteristic of the VCO 103 at another time. For example, the correction section 108 may start to measure the f-V characteristic of the VCO 103 at an arbitrary time (not shown) after a predetermined time period has passed from the start time t1 of the first time period shown in FIG. 3. In this case, when the predetermined time period (not shown) has passed from the carrier wave frequency change start time t1, the characteristic measurement time control section 110 notifies the correction section 108 of the time at which the measurement of the f-V characteristic of the VCO 103 is to be started. The characteristic measurement time control section 110 notifies the correction section 108 of the time at which the f-V characteristic measurement is to be ended when a predetermined time period has passed after indicating the f-V characteristic measurement start time. Also in this method, the correction section 108 can measure the f-V characteristic of the VCO 103.

Figure 7:
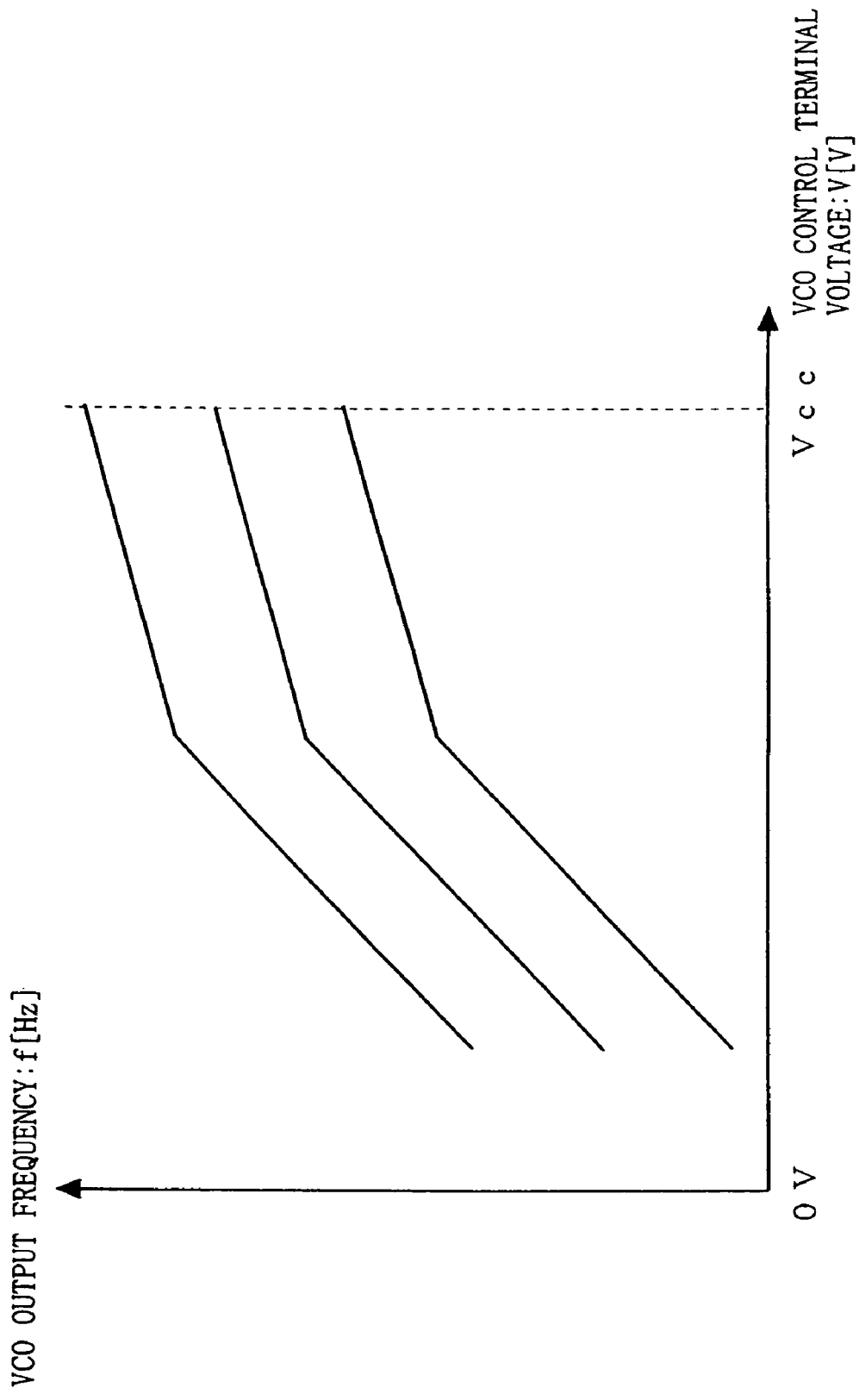
FIG. 7 is a diagram illustrating a VCO having f-V characteristics of a plurality of types.

FIG. 7 is a diagram illustrating a VCO having f-V characteristics of a plurality of types. As shown in FIG. 7, some VCOs may have the f-V characteristics of a plurality of types so as to broaden a range of the carrier wave frequencies outputted by the VCO. Such a VCO can exhibit a similar effect to that described in the first embodiment of the present invention.

Second Embodiment

Figure 8:
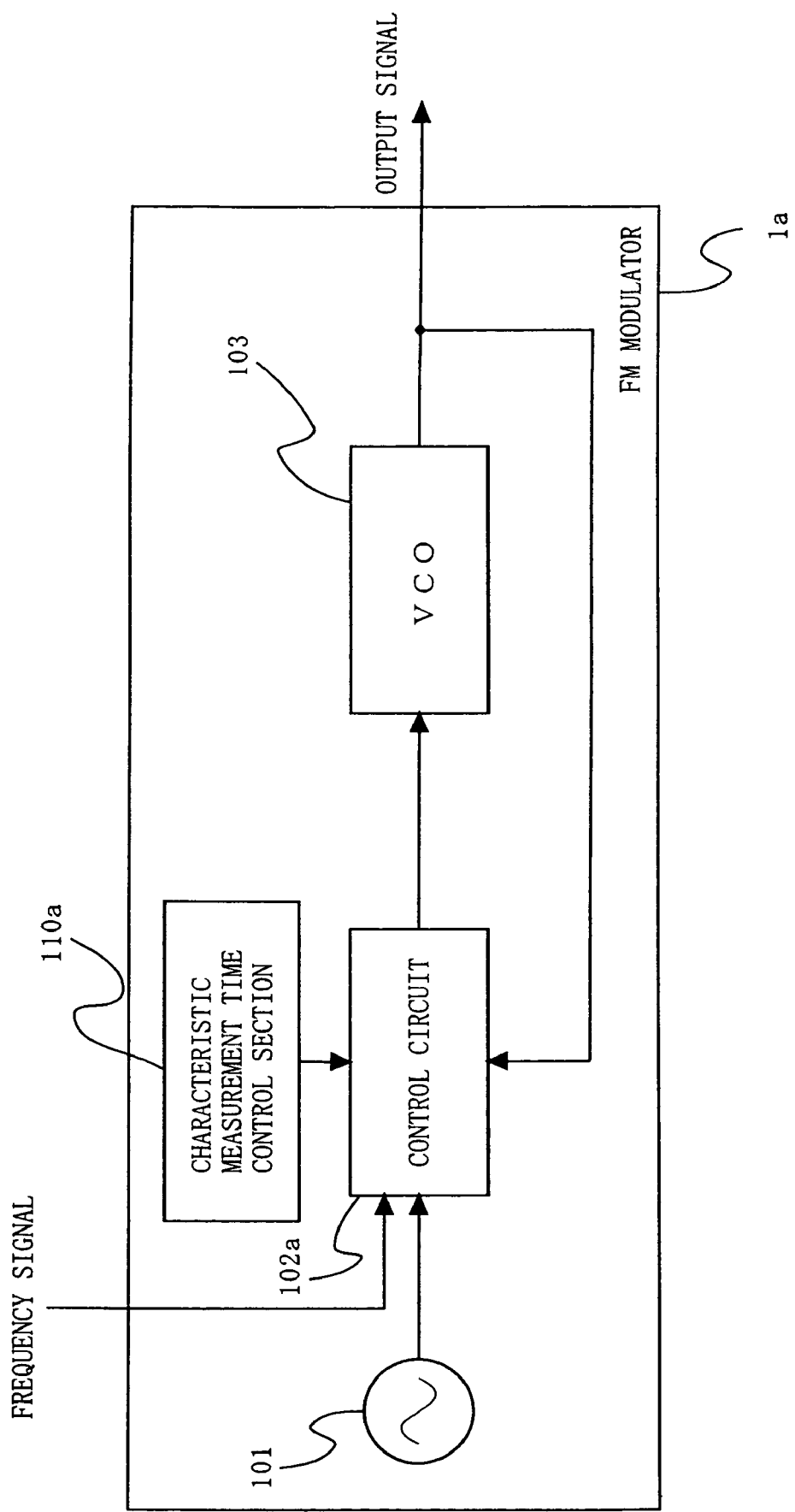
FIG. 8 is a schematic block diagram illustrating a structure of an FM modulator 1a according to a second embodiment of the present invention.
Figure 9:
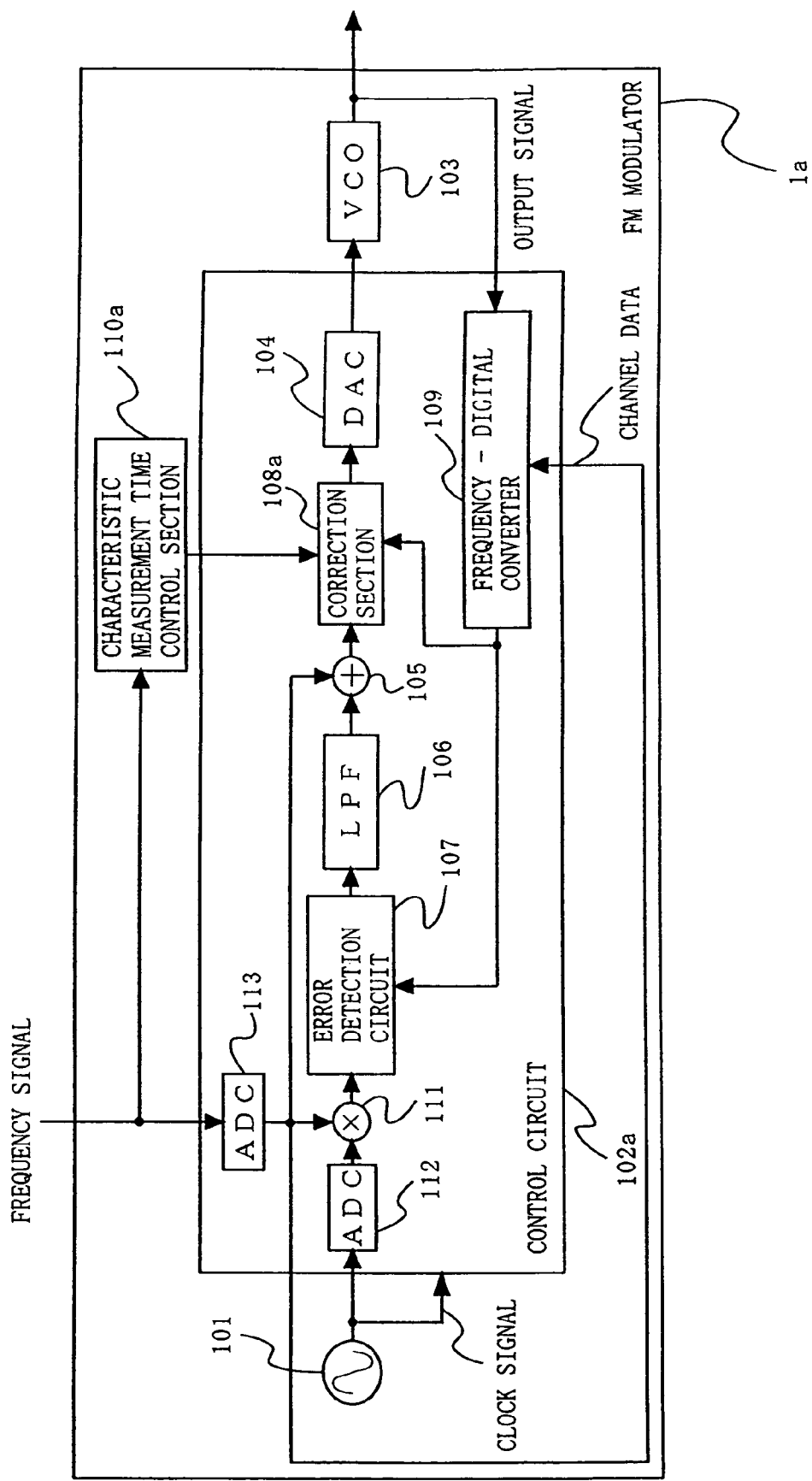
FIG. 9 is a block diagram illustrating in detail the structure of the FM modulator 1a according to the second embodiment of the present invention.

A second embodiment of the present invention will be described with reference to the drawings. FIG. 8 is a schematic diagram illustrating a structure of an FM modulator 1a according to the second embodiment of the present invention. FIG. 9 is a block diagram illustrating in detail the structure of the FM modulator 1a according to the second embodiment of the present invention. As shown in FIG. 8, the FM modulator 1a comprises the reference signal generator 101, a control circuit 102a, the VCO 103, and a characteristic measurement time control section 110a. As shown in FIG. 9, the control circuit 102a includes: the DAC 104; the adder 105; the LPF 106; the error detection circuit 107; a correction section 108a; the frequency-digital converter 109; the multiplier 111; the ADC 112, and the ADC 113. In the second embodiment, the same components as described for the first embodiment are denoted by the same reference numerals, and no detailed description thereof is given. The FM modulator 1a shown in FIGS. 8 and 9 is different from the FM modulator 1 shown in FIG. 2 in the following two points.

Firstly, the characteristic measurement time control section 110a and the correction section 108a included in the control circuit 102a perform operations at operation times different from those described for the first embodiment. In the FM modulator 1 shown in FIG. 2, after the correction section 108 is notified, by the characteristic measurement time control section 110, of the time at which the f-V characteristic measurement is to be started, the correction section 108 measures the f-V characteristic of the VCO 103 in the first time period. However, the FM modulator 1a shown in FIG. 9 measures the f-V characteristic of the VCO 103 in a second time period from time t4 to time t5 shown in FIG. 3.

Secondly, the correction section 108 shown in FIG. 2 stores the input values to the DAC 104 and the output signals from the frequency-digital converter 109 when the correction section 108 is notified, by the characteristic measurement time control section 110, of the time at which the measurement of the f-V characteristic of the VCO 103 is to be started. However, the correction section 108a shown in FIG. 9 voluntarily outputs, to the DAC 104, digital values corresponding to a positive and a negative control voltages when the correction section 108a is notified, by the characteristic measurement time control section 110a, of the time at which the measurement of the f-V characteristic of the VCO 103 is to be started. The value inputted to the VCO 103 from the DAC 104 varies depending on the digital value which is voluntarily outputted by the correction section 108a. The output signal from the VCO 103 varies depending on the value inputted to the VCO 103 from the DAC 104. The output signal from the frequency-digital converter 109 varies depending on the output signal from the VCO 103. The correction section 108a is different from the correction section 108 shown in FIG. 2 in that the correction section 108a stores the digital values outputted by the correction section 108a associated with the respective output signals from the frequency digital converter 109 which vary depending on the digital values A plurality of positive and negative digital values outputted by the correction section 108a need to be digital values corresponding to all frequencies of the output signal from the VCO 103 which are obtained after the start of the FM modulation using the desired frequency to which the carrier wave frequency has changed.

In the second embodiment, the characteristic measurement time control section 110a determines the f-V characteristic measurement start time as time t4 at which the second time period starts. Further, in the second embodiment, the characteristic measurement time control section 110a determines the f-V characteristic measurement end time as a time at which the correction section 108a completes the output of the necessary positive and the negative digital values.

Figure 10:
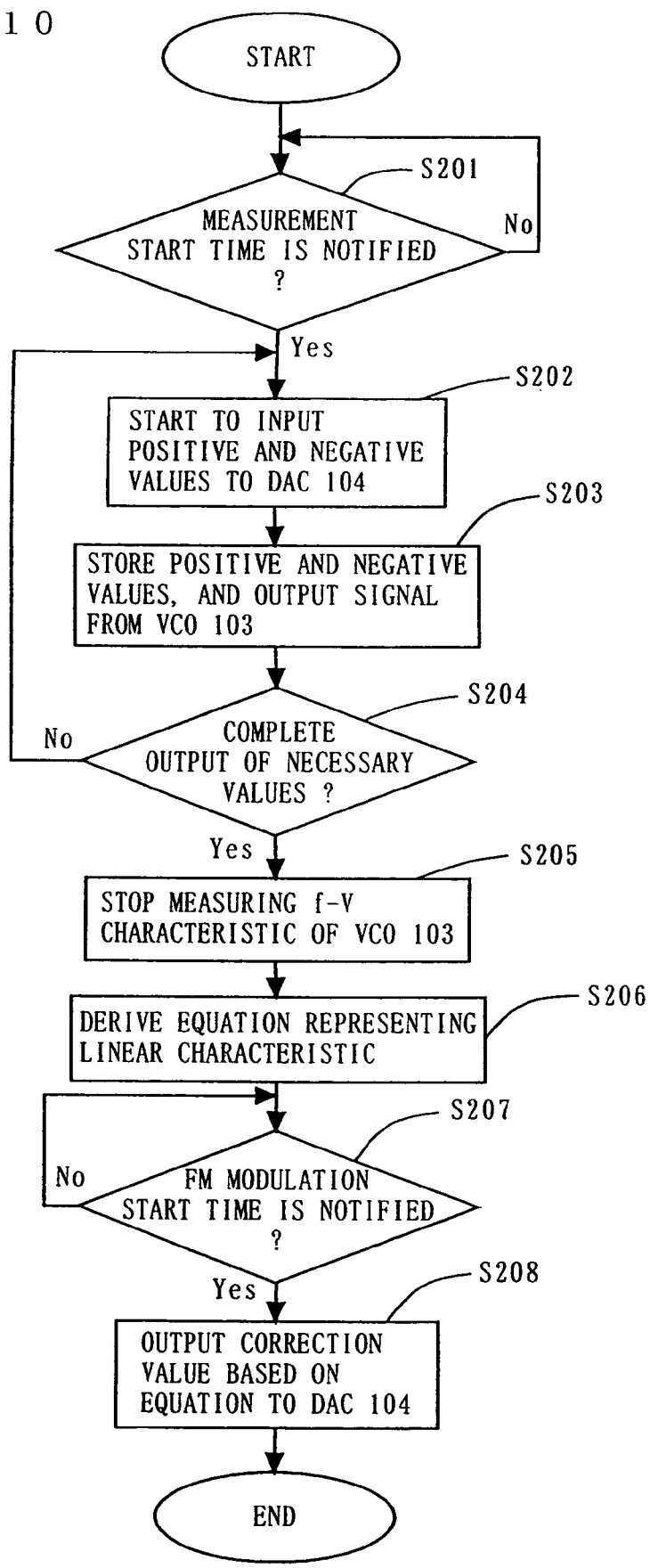
FIG. 10 is a flow chart of an operation performed by the correction section 108a according to the second embodiment of the present invention.

FIG. 10 is a flow chart of an operation performed by the correction section 108a according to the second embodiment. Hereinafter, with reference to FIGS. 3, 9, and 10, the operation performed by the FM modulator 1a according to the second embodiment will be described in detail.

With reference to FIG. 10, at time t1 at which the carrier wave frequency starts to change, the characteristic measurement time control section 110a detects for a change of the channel data. After the change of the channel data has been detected, at time t4, the characteristic measurement time control section 110a notifies the correction section 108a of the time at which the f-V characteristic measurement is to be started. The correction section 108a determines in step S201 whether or not the correction section 108a has been notified, by the characteristic measurement time control section 110a, of the time at which the f-V characteristic measurement is to be started. When the correction section 108a has been notified of the time at which the f-V characteristic measurement is to be started, the process advances to step S202. On the other hand, when the correction section 108a has not been notified of the time at which the f-V characteristic measurement is to be started, the process is returned to step S201.

In step S202, the correction section 108a starts to input the plurality of positive and negative digital values to the DAC 104 so as to start the measurement of the f-V characteristic of the VCO 103. In step S203, the correction section 108a stores the plurality of positive and negative digital values outputted by the correction section 108a associated with the output signals from the frequency-digital converter 109, respectively.

Next, the correction section 108a determines in step S204 whether or not the output of the necessary positive and negative digital values has been completed. When the output has been completed, the process advances to step S205. On the other hand, when the output is not completed, the process is returned to step S202.

In step S205, the correction section 108a ends the measurement of the f-V characteristic of the VCO 103.

Next, in step S206, the correction section 108a derives an equation representing a linear characteristic of the VCO 103 based on the output signals from the frequency-digital converter 109 and the plurality of positive and negative digital values outputted by the correction section 108a, both of which have been stored in the correction section 108a.

Next, the correction section 108a determines in step S207 whether or not the correction section 108a has been notified, by the characteristic measurement time control section 110a, of the time at which the FM modulation using the desired frequency is to be started. When the correction section 108a has been notified of the time at which the FM modulation using the desired frequency is to be started, the process advances to step S208. On the other hand, when the correction section 108a has not been notified of the time at which the FM modulation using the desired frequency is to be started, the process is returned to step S207.

In step S208, the correction section 108a calculates the correction value based on the input value from the adder 105 using the equation having been derived, and outputs the correction value to the DAC 104.

The method in which the correction section 108a calculates the linear characteristic from the f-V characteristic of the VCO 103 having been measured, and determines the correction value is the same as described for the first embodiment.

As described above, according to the second embodiment, in the process of the carrier wave frequency being changed, the correction section 108a measures the f-V characteristic in the second time period in which the carrier wave frequency reaches the predetermined frequency range including the desired frequency. The correction section 108a stores the output signals from the frequency-digital converter 109, and the positive and negative digital values, corresponding to only the necessary frequencies, outputted by the correction section 108a. Therefore, the f-V characteristic of the VCO 103 can be measured in a reduced time period, and a capacity of memory allocated to the correction table can be reduced. The second time period from time t4 to t5 as shown in FIG. 3 is a time period indispensable to the locking of the PLL circuit. Therefore, in the second embodiment of the present invention, a time period, which has not been used in a conventional art, can be effectively utilized.

Further, the f-V characteristic of the VCO 103 is changed depending on a temperature and a reduction in power supply voltage. When the second embodiment of the present invention is used in a wireless system, a power amplifier which generates a large amount of heat when mounted in a substantially small device and the VCO 103 are mounted on the same substrate. Therefore, an error may occur in the correction signal outputted by the correction section 108a while the FM modulator 1a is being operated. However, according to the second embodiment of the present invention, the correction section 108a measures the f-V characteristic of the VCO 103 each time the carrier wave frequency is changed. Therefore, according to the second embodiment of the present invention, it is possible to suppress the error in the correction signal occurring due to the change of the f-V characteristic of the VCO 103 which is caused by the temperature change and the reduction in power supply voltage while the FM modulator 1a is being operated.

The time at which the correction section 108a starts to measure the f-V characteristic of the VCO 103 may be other than time t4 shown in FIG. 3. For example, the correction section 108a may start to measure the f-V characteristic of the VCO 103 at an arbitrary time in the second time period.

Third Embodiment

Figure 11:
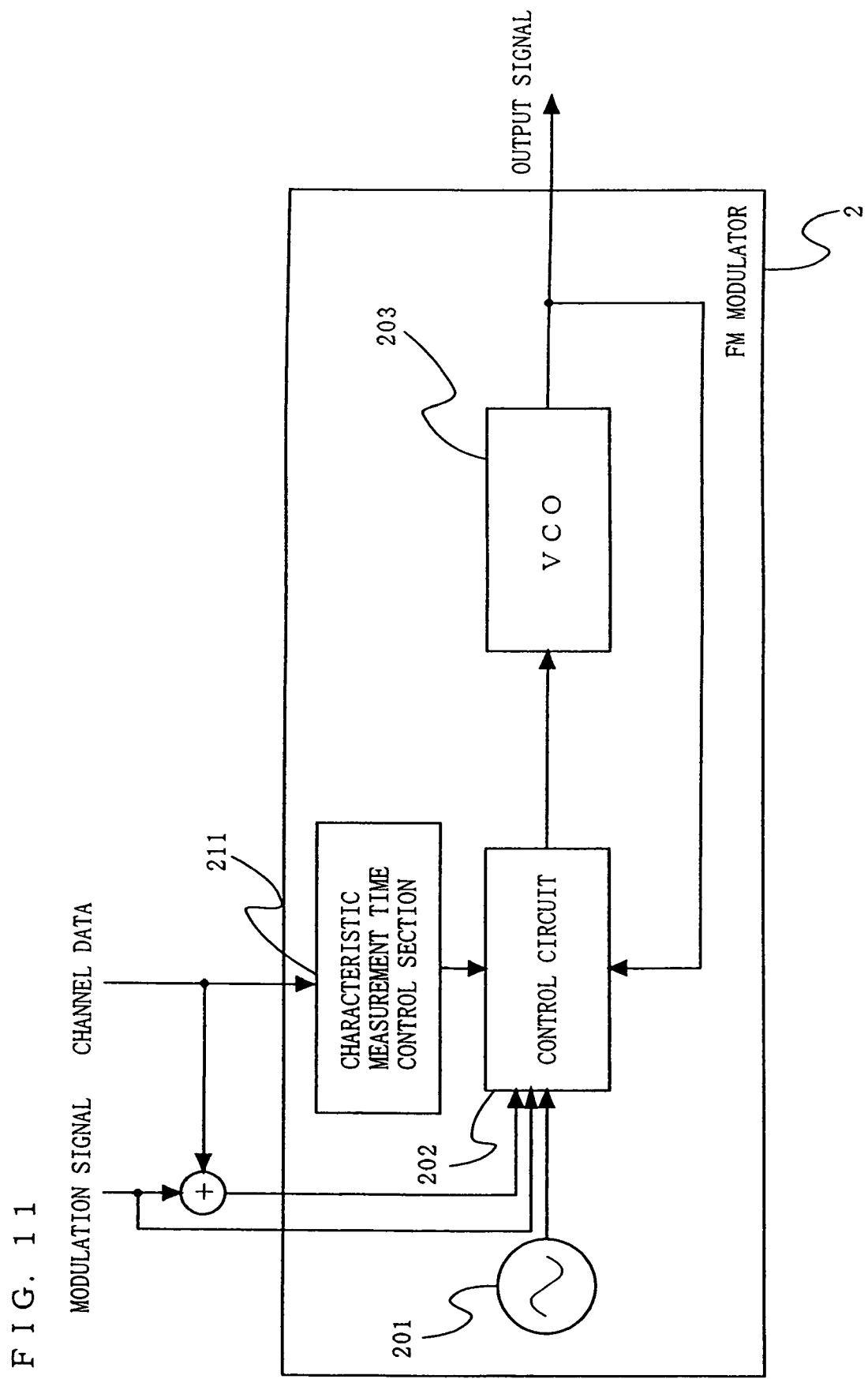
FIG. 11 is a schematic block diagram illustrating a structure of an FM modulator 2 according to a third embodiment of the present invention.

A third embodiment of the present invention will be described with reference to the drawings. FIG. 11 is a schematic diagram illustrating a structure of an FM modulator 2 according to the third embodiment of the present invention. As shown in FIG. 11, the FM modulator 2 comprises: a reference signal generator 201; a control circuit 202; a VCO 203; and a characteristic measurement time control section 211. Although the control circuit of the first embodiment is configured as a digital circuit, portions, other than a VCO gain correction section, of the control circuit 202 of the third embodiment are configured as an analog circuit. In this point, the third embodiment of the present invention is different from the first embodiment of the present invention.

The reference signal generator 201 generates a reference signal. The reference signal having been generated is multiplied by a modulation signal inputted to the FM modulator 2 from outside thereof so as to be used for an FM modulation.

The control circuit 202 multiplies the reference signal generated by the reference signal generator 201 by the modulation signal inputted to the FM modulator 2 from outside thereof. The control circuit 202 compares a phase of the signal obtained through the multiplication with a phase of an output signal from the VCO 203 so as to synchronize the phase of the signal obtained through the multiplication and the phase of the output signal from the VCO 203.

The VCO 203 outputs a signal having a frequency corresponding to a control voltage applied to the VCO control terminal. An analog voltage outputted by the control circuit 202 is applied to the VCO control terminal.

The characteristic measurement time control section 211 notifies the control circuit 202 of a time at which a correction value of the control voltage applied to the VCO 203 is to be calculated. The control circuit 202 calculates the correction value for the control voltage at the time indicated by the characteristic measurement time control section 211, and corrects, using the correction value, the control voltage to be applied to the VCO 203.

Hereinafter, the structure of the FM modulator 2 will be described in detail.

Figure 12:
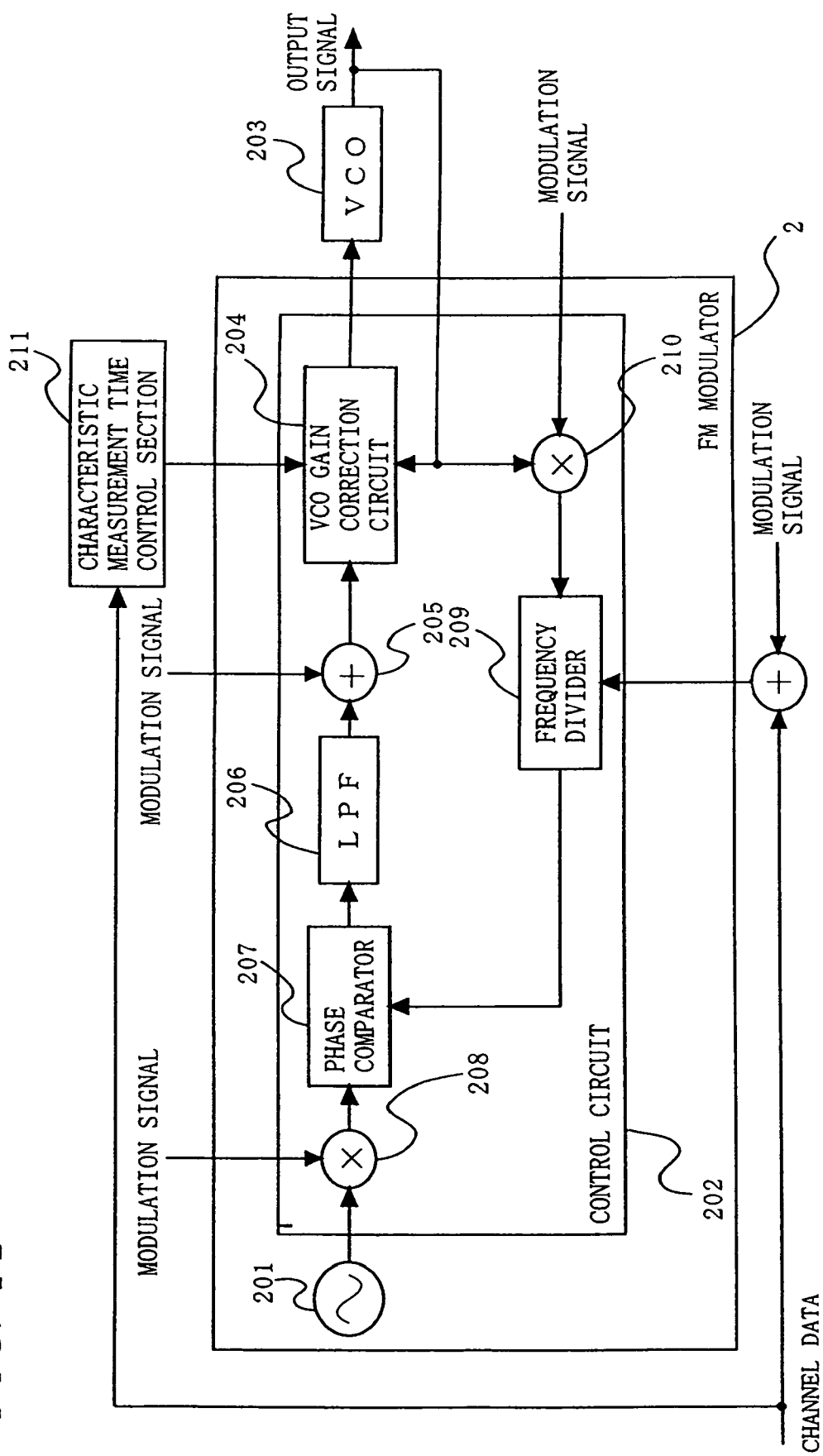
FIG. 12 is a block diagram illustrating in detail the structure of the FM modulator 2 according to the third embodiment of the present invention.

FIG. 12 is a block diagram illustrating in detail the structure of the FM modulator 2 according to the third embodiment of the present invention. As shown in FIG. 12, the control circuit 202 includes: a VCO gain correction section 204; an adder 205; an LPF 206; a phase comparator 207; multipliers 208, 210; and a frequency divider 209.

The multiplier 210 multiplies a modulation signal inputted to the FM modulator 2 from outside thereof by the output signal from the VCO 203, and supplies a signal obtained through the multiplication to the frequency divider 209.

The frequency divider 209 frequency-divides the signal having been received from the multiplier 210, and outputs a frequency-divided signal to the phase comparator 207. The frequency dividing ratio used by the frequency divider 209 is determined based on channel data inputted to the FM modulator 2 from outside thereof. A frequency of a carrier wave outputted by the FM modulator 2 is obtained as a product of the frequency dividing ratio used by the frequency divider 209 and a frequency of the reference signal.

The multiplier 208 multiplies the reference signal generated by the reference signal generator 201 by the modulation signal inputted to the FM modulator 2 from outside thereof. The multiplier 208 supplies a signal obtained through the multiplication to the phase comparator 207.

The phase comparator 207 compares a phase of the input signal from the multiplier 208 with a phase of the output signal from the frequency-divider 209 so as to output a pulse signal in accordance with the comparison result. Specifically, the phase comparator 207 detects for a phase difference between the input signal from the multiplier 208 and the output signal from the frequency-divider 209, and outputs the pulse signal having a pulse width corresponding to a time difference.

The LPF 206 subjects, to filtering, the pulse signal outputted by the phase comparator 207 so as to eliminate a high frequency component from the pulse signal using, for example, integration and averaging.

The adder 205 adds the output signal from the LPF 206 to the modulation signal inputted to the FM modulator 2 from outside thereof.

The characteristic measurement time control section 211 monitors the channel data inputted to the FM modulator 2 from outside thereof. The characteristic measurement time control section 211 detects for a change of the channel data so as to determine times at which the FM modulation is to be started and ended, and times at which the measurement of the f-V characteristic of the VCO 203 is to be started and ended, and notifies the VCO gain correction section 204 of the times.

Times at which the characteristic measurement time control section 211 performs operations according to the third embodiment of the present invention will be described with reference to FIG. 3. The f-V characteristic measurement start time determined by the characteristic measurement time control section 211 is time t1 at which the channel data is changed and the carrier wave frequency starts to change. Further, according to the third embodiment, the characteristic measurement time control section 211 determines the f-V characteristic measurement end time in the first time period.

According to the third embodiment, the times at which the measurement of the f-V characteristic of the VCO 203 is to be started and ended are not restricted to the aforementioned times. Examples of other times will be described below.

The correction table and the operation of the VCO gain correction section 204 according to the third embodiment are the same as those described for the first embodiment, and no detailed description thereof is given.

At time t1, the change of the carrier wave frequency is started. At time t4 at which the carrier wave frequency reaches a predetermined frequency range including a desired frequency to which the carrier wave frequency has changed, the characteristic measurement time control section 211 notifies the VCO gain correction section 204 of a time at which the f-V characteristic measurement is to be ended. When the VCO gain correction section 204 is notified, by the characteristic measurement time control section 211, of the time at which the f-V characteristic measurement is to be ended, the VCO gain correction section 204 stops storing the control voltages applied to the VCO 203 and the output signals from the VCO 203.

When the VCO gain correction section 204 ends the measurement of the f-V characteristic of the VCO 203, the VCO gain correction section 204 derives an equation representing a favorable linear characteristic of the VCO 203 based on the control voltages applied to the VCO 203 and the outputs signals from the VCO 203, both of which have been stored therein.

At time t5 at which the FM modulation using the desired frequency to which the carrier wave frequency has changed is to be started, the characteristic measurement time control section 211 notifies the VCO gain correction section 204 of a time at which the correction operation is to be started.

When the VCO gain correction section 204 has been notified, by the characteristic measurement time control section 211, of the time at which the correction operation is to be started, the VCO gain correction section 204 calculates a frequency of the output signal from the VCO 203 based on a signal received from the adder 205 using the equation having been derived. The VCO gain correction section 204 searches the correction table for a value corresponding to the calculated frequency, and outputs, to the VCO 203, the value as the correction value. Thus, the VCO gain correction section 204 is capable of correcting the output signal from the VCO 203.

Between the start of the change from the first carrier wave frequency to the desired frequency and the start of the FM modulation using the desired frequency, the VCO gain correction section 204 outputs input signals from the adder 205 directly to the VCO 203. This is because, when the VCO gain correction section 204 does not output, to the VCO 203, a phase difference signal detected by the phase comparator 207, the carrier wave frequency does not reach the desired frequency.

Further, a plurality of modulation signals are simultaneously inputted as shown in FIG. 12 so as to obtain low-frequency to high-frequency modulation characteristics for the PLL circuit including the control circuit 202 and the VCO 203. The modulation signals are inputted to the multiplier 210, the frequency divider 209, and the multiplier 208 so as to obtain the low-frequency modulation characteristic. The modulation signal is inputted to the adder 205 so as to obtain the high-frequency modulation characteristic.

As described above, when the FM modulator 2 is constructed as shown in FIG. 12, the multiplier 210 multiplies the output signal from the VCO 203 by the modulation signal inputted to the FM modulator 2 from outside thereof in the control circuit 202. The multiplier 210 supplies the signal obtained through the multiplication to the frequency divider 209. The frequency divider 209 frequency-divides the signal received from the multiplier 210, and outputs the frequency-divided signal to the phase comparator 207. The phase comparator 207 detects for a phase difference between the signal outputted by the multiplier 208 and the signal outputted by the frequency-divider 209 so as to output the pulse signal corresponding to the phase difference having been detected. The LPF 206 subjects the pulse signal outputted by the phase comparator 207 to filtering so as to output a DC value. The adder 205 adds the modulation signal inputted to the FM modulator 2 from outside thereof to the DC value corresponding to the phase difference outputted by the LPF 206. The VCO gain correction section 204 calculates the correction value based on the input signal from the adder 205 at the correction operation start time indicated by the characteristic measurement time control section 211, and outputs the correction value to the VCO 203. By repeating the aforementioned operation, the phase difference detected by the phase comparator 207 is reduced so as to synchronize the phase from the output signal from the VCO 203 and the phase of the output signal supplied from the multiplier 208 to the phase comparator 207.

Figure 13:
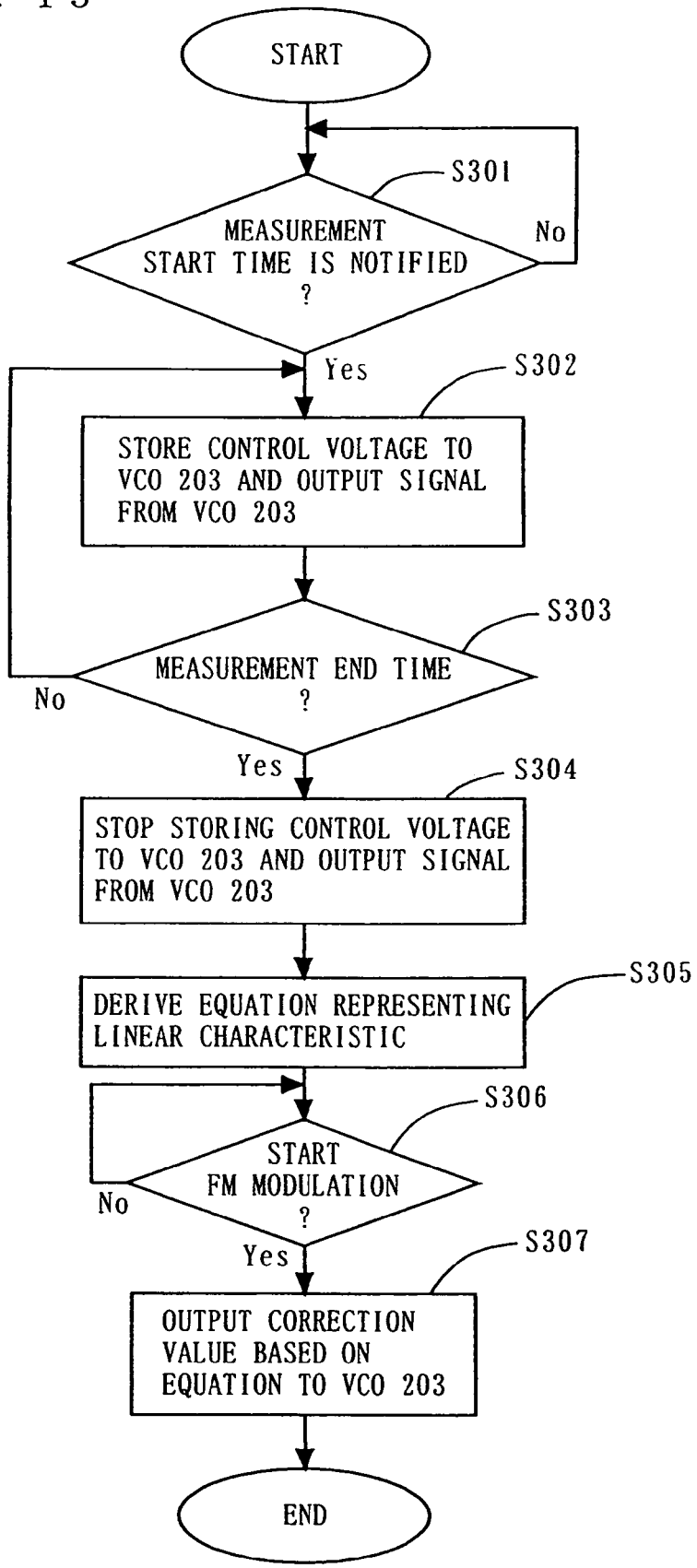
FIG. 13 is a flow chart of an operation performed by the VCO gain correction section 204 according to the third embodiment of the present invention.

FIG. 13 is a flow chart of an operation performed by the VCO gain correction section 204. Hereinafter, with reference to FIGS. 3, 12, and 13, the operation performed by the VCO gain correction section 204 according to the third embodiment of the present invention will be described in detail.

With reference to FIG. 13, at time t1 at which the carrier wave frequency starts to change, the characteristic measurement time control section 211 detects for a change of the channel data. When the characteristic measurement time control section 211 detects the change of the channel data, the characteristic measurement time control section 211 notifies the VCO gain correction section 204 of the time at which the f-V characteristic measurement is to be started. The VCO gain correction section 204 determines in step S301 whether or not the VCO gain correction section 204 has been notified, by the characteristic measurement time control section 2, of the time at which the f-V characteristic measurement is to be started. When the VCO gain correction section 204 has been notified of the time at which the f-V characteristic measurement is to be started, the process advances to step S302. On the other hand, when the VCO gain correction section 204 has not been notified of the time at which the f-V characteristic measurement is to be started, the process is returned to step S301.

In step S302, the VCO gain correction section 204 stores the control voltages applied to the VCO 203 and the output signals from the VCO 203. The VCO gain correction section 204 determines in step S303 whether or not the VCO gain correction section 204 has been notified, by the characteristic measurement time control section 211, of the time at which the f-V characteristic measurement is to be ended. When the VCO gain correction section 204 has been notified of the time at which the f-V characteristic measurement is to be ended, the process advances to step S304. On the other hand, when the VCO gain correction section 204 has not been notified of the time at which the f-V characteristic measurement is to be ended, the process is returned to step S302.

In step S304, the VCO gain correction section 204 ends the measurement of the f-V characteristic of the VCO 203.

Next, in step S305, the VCO gain correction section 204 derives an equation representing a linear characteristic based on the control voltages to the VCO 203 and the output signals from the VCO 203 between time t4 and time t5 at which the FM modulation using the desired frequency is started.

Next, the VCO gain correction section 204 determines in step S306 whether or not the VCO gain correction section 204 has been notified, by the characteristic measurement time control section 211, of the time at which the FM modulation using the desired frequency is to be started. When the VCO gain correction section 204 has been notified of the time at which the FM modulation using the desired frequency is to be started, the process advances to step S307. On the other hand, when the VCO gain correction section 204 has not been notified of the time at which the FM modulation using the desired frequency is to be started, the process is returned to step S306.

In step S307, the VCO gain correction section 204 calculates the correction value based on the input value from the adder 205 using the equation having been derived, and outputs, to the VCO 203, the correction value as the control voltage.

The VCO gain correction section 204 calculates the linear characteristic based on the f-V characteristic of the VCO 203 having been measured, and outputs the correction value in the same manner as that described for the correction circuit 108 of the first embodiment.

As described above, according to the third embodiment, the VCO gain correction section 204 measures the f-V characteristic in the first time period. Accordingly, the control voltage to be applied to the VCO 203, and the output signal from the VCO 203, both of which are stored in the VCO gain correction section 204, each has a value representing a frequency in a frequency range including the desired frequency as represented by the carrier wave frequency curved line between time t1 and time t4 shown in FIG. 3. Therefore, although in a conventional art the f-V characteristic is measured when the VCO is powered on, the VCO gain correction section 204 measures the f-V characteristic of the VCO 203 while the carrier wave frequency is being changed, thereby enabling the measurement of the f-V characteristic of the VCO 203 in a reduced time period and reduction of the capacity of memory allocated to the correction table. The first time period from time t1 to time t4 as shown in FIG. 3 is a time period indispensable to the locking of the PLL circuit. Therefore, in the third embodiment of the present invention, a time period, which has not been used in a conventional art, can be effectively utilized.

Further, the f-V characteristic of the VCO 203 is changed depending on a temperature and a reduction in power supply voltage. When the third embodiment of the present invention is used in a wireless system, a power amplifier which generates a large amount of heat when mounted in a substantially small device and the VCO 203 are mounted on the same substrate. Therefore, an error may occur in the correction signal outputted by the VCO gain correction section 204 while the FM modulator 2 is being operated. However, according to the third embodiment of the present invention, the VCO gain correction section 204 measures the f-V characteristic of the VCO 203 each time the carrier wave frequency is changed. Therefore, according to the present invention, it is possible to suppress the error in the correction signal occurring due to the change of the f-V characteristic of the VCO 203 which is caused by the temperature change and the reduction in power supply voltage while the FM modulator 2 is being operated.

Although in the third embodiment the VCO gain correction section 204 starts to measure the f-V characteristic of the VCO 203 at time t1 shown in FIG. 3, the VCO gain correction section 204 may start to measure the f-V characteristic of the VCO 203 at another time. For example, the VCO gain correction section 204 may start to measure the f-V characteristic of the VCO 203 when the VCO 203 is powered on. In this case, the VCO 203 is powered on at time t1 as shown in FIG. 3, and the process of the carrier wave frequency reaching the predetermined frequency range after the VCO 203 is powered on is the same as the process after time t1 shown in FIG. 3.

Although in the third embodiment the VCO gain correction section 204 starts to measure the f-V characteristic of the VCO 203 at time t1 shown in FIG. 3, the VCO gain correction section 204 may start to measure the f-V characteristic of the VCO 203 at another time. For example, at a time, represented by, for example, time t2 in the first time period, at which the phase of the carrier wave frequency is inverted, the VCO gain correction section 204 may start to measure the f-V characteristic of the VCO 203. In this case, at time t2, the characteristic measurement time control section 211 notifies the VCO gain correction section 204 of the time at which the measurement of the f-V characteristic of the VCO 203 is to be started. The characteristic measurement time control section 211 notifies the VCO gain correction section 204 of the time at which the f-V characteristic measurement is to be ended at a time (not shown) at which the phase of the carrier wave frequency is inverted for the second time after the measurement of the f-V characteristic has been started. The time, at which the phase of the carrier wave frequency is inverted for the second time after the measurement of the f-V characteristic has been started, is preset in the characteristic measurement time control section 211. Also in this method, the VCO gain correction section 204 can measure the f-V characteristic of the VCO 203.

Although in the third embodiment the VCO gain correction section 204 starts to measure the f-V characteristic of the VCO 203 at time t1 shown in FIG. 3, the VCO gain correction section 204 may start to measure the f-V characteristic of the VCO 203 at another time. For example, the VCO gain correction section 204 may start to measure the f-V characteristic of the VCO 203 at an inflection point of the carrier wave frequency represented by, for example, time t3 while the carrier wave frequency is being changed as shown in FIG. 3. In this case, at time t3, the characteristic measurement time control section 211 notifies the VCO gain correction section 204 of the time at which measurement of the f-V characteristic of the VCO 203 is to be started. The characteristic measurement time control section 211 notifies the VCO gain correction section 204 of the time at which the f-V characteristic measurement is to be ended at an inflection point (not shown) obtained immediately after the measurement of the f-V characteristic has been started. The inflection point obtained immediately after the measurement of the f-V characteristic has been started is preset in the characteristic measurement time control section 211. Also in this method, the VCO gain correction section 204 can measure the f-V characteristic of the VCO 203.

Although in the third embodiment the VCO gain correction section 204 starts to measure the f-V characteristic of the VCO 203 at time t1 shown in FIG. 3, the VCO gain correction section 204 may start to measure the f-V characteristic of the VCO 203 at another time. For example, the VCO gain correction section 204 may start to measure the f-V characteristic of the VCO 203 at an arbitrary time (not shown) in the first time period after a predetermined time period has passed from the carrier wave frequency change start time t1. In this case, when the predetermined time period (not shown) has passed from the carrier wave frequency change start time t1, the characteristic measurement time control section 211 notifies the VCO gain correction section 204 of the time at which measurement of the f-V characteristic of the VCO 203 is to be started. The characteristic measurement time control section 211 notifies the VCO gain correction section 204 of the time at which the f-V characteristic measurement is to be ended when the predetermined time period has passed after the f-V characteristic measurement start time has been indicated. Also in this method, the VCO gain correction section 204 can measure the f-V characteristic of the VCO 203.

As shown in FIG. 7, some VCOs may have the f-V characteristics of a plurality of types so as to broaden a range of the carrier wave frequencies outputted by the VCO. Such a VCO can exhibit a similar effect to that described in the third embodiment of the present invention.

Fourth Embodiment

Figure 14:
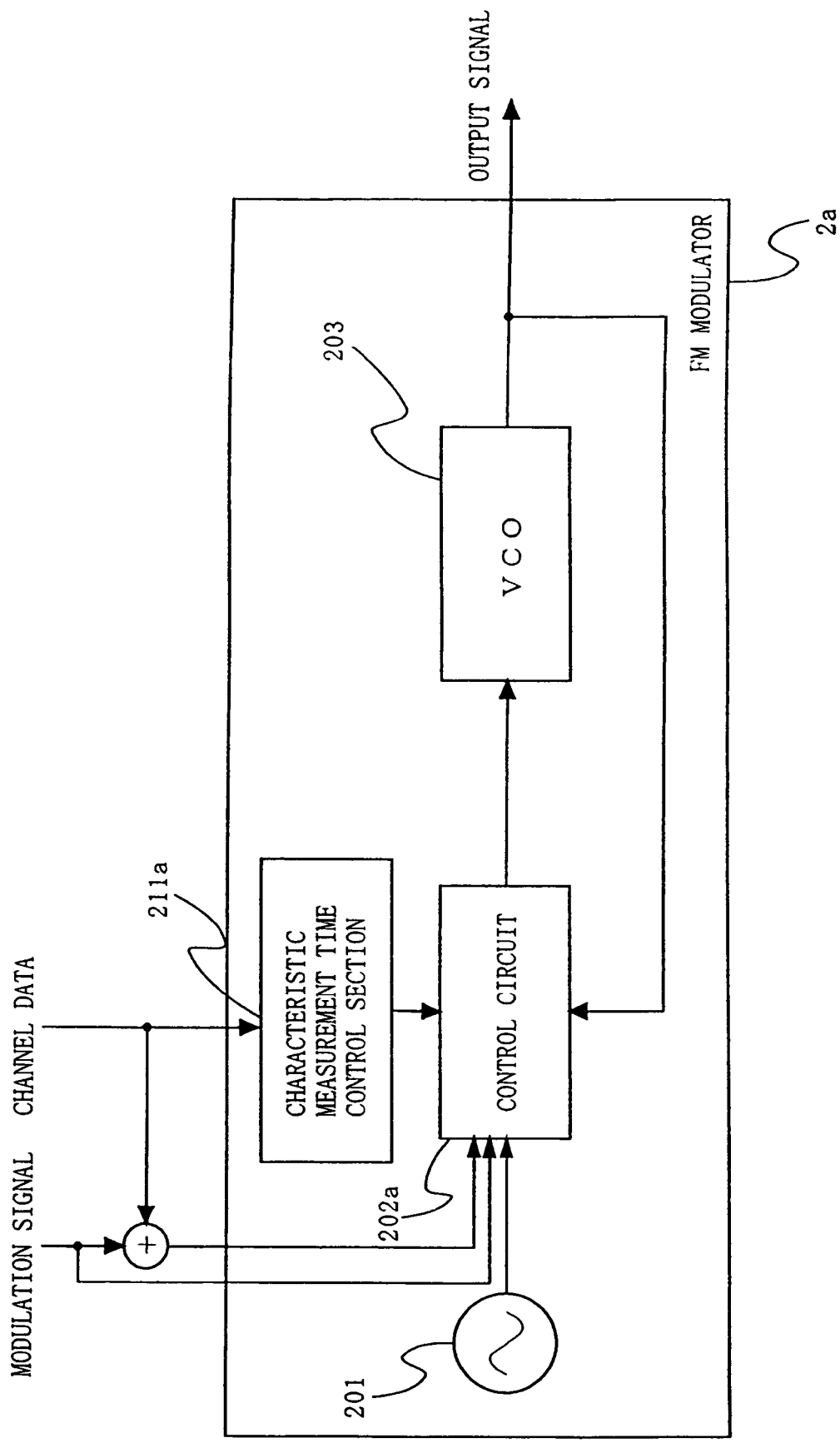
FIG. 14 is a schematic block diagram illustrating a structure of an FM modulator 2a according to a fourth embodiment of the present invention.
Figure 15:
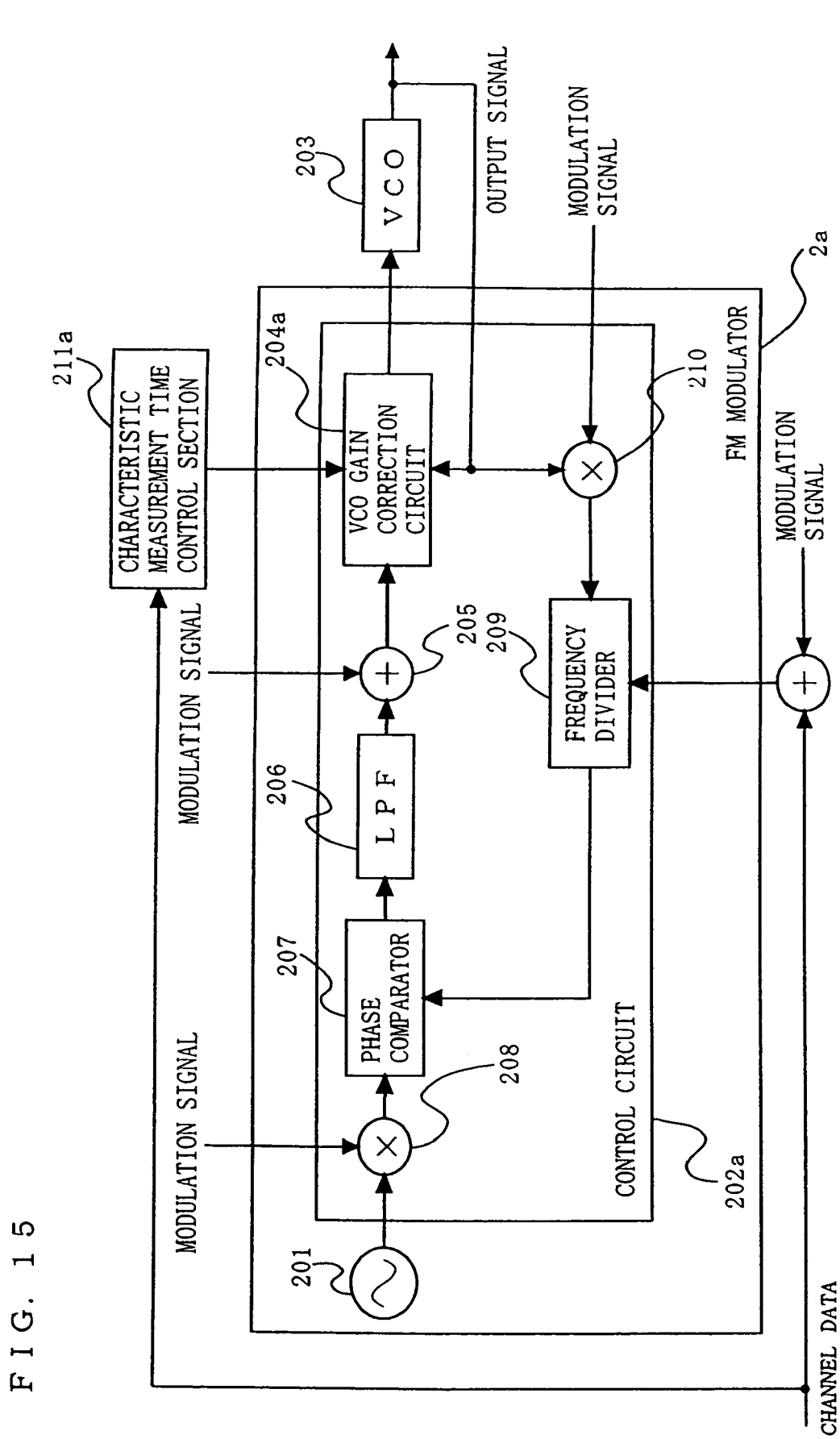
FIG. 15 is a block diagram illustrating in detail the structure of the FM modulator 2a according to the fourth embodiment of the present invention.

Hereinafter, a fourth embodiment of the present invention will be described with reference to the drawings. FIG. 14 is a schematic diagram illustrating a structure of an FM modulator 2a according to the fourth embodiment of the present invention. FIG. 15 is a block diagram illustrating in detail the structure of the FM modulator 2a according to the fourth embodiment of the present invention. As shown in FIG. 14, the FM modulator 2a comprises the reference signal generator 201, a control circuit 202a, the VCO 203, and a characteristic measurement time control section 211a. As shown in FIG. 15, the control circuit 202a includes: a VCO gain correction section 204a; the adder 205; the LPF 206; the phase comparator 207; the multipliers 208 and 210; and the frequency divider 209. In the fourth embodiment, the same components as described for the third embodiment are denoted by the same reference numerals, and no detailed description thereof is given. The FM modulator 2a shown in FIGS. 14 and 15 are different from the FM modulator 2 shown in FIG. 12 in the following two points.

Firstly, the characteristic measurement time control section 211a, and the VCO gain correction section 204a included in the control circuit 202a performs operations at operation times different from those of the FM modulator 2 shown in FIG. 12. In the FM modulator 2 shown in FIG. 12, the VCO gain correction section 204 measures the f-V characteristic of the VCO 203 in the first time period when the VCO gain correction section 204 is notified, by the characteristic measurement time control section 211, of the time at which the f-V characteristic measurement is to be started. However, the FM modulator 2a shown in FIG. 15 measures the f-V characteristic of the VCO 203 in the second time period. In this point, the FM modulator 2a shown in FIG. 15 is different from the FM modulator 2 shown in FIG. 12.

Secondly, the VCO gain correction section 204 shown in FIG. 12 stores the control voltages to the VCO 203 and the output signals from the VCO 203 when the VCO gain correction section 204 is notified, by the characteristic measurement time control section 211, of the time at which the measurement of the f-V characteristic of the VCO 203 is to be started. However, the VCO gain correction section 204a shown in FIG. 15 voluntarily outputs a positive and a negative control voltages to the VCO 203 when the VCO gain correction section 204a is notified, by the characteristic measurement time control section 211a, of the time at which the measurement of the f-V characteristic of the VCO 203 is to be started. The output signal from the VCO 203 varies depending on the control voltage applied by the VCO gain correction section 204a. The VCO gain correction section 204a is different from the VCO gain correction section 204 shown in FIG. 12 in that the VCO gain correction section 204a stores the positive and negative control voltages outputted by the VCO gain correction section 204a associated with the respective output signals from the VCO 203.

A plurality of positive and negative control voltages outputted by the VCO gain correction section 204a need to correspond to all frequencies, of the output signal from the VCO 203, which are obtained after the FM modulation using the desired frequency, to which the carrier wave frequency has changed, is started.

Times at which the VCO gain correction section 204a according to the fourth embodiment of the present invention performs operations will be described with reference to FIG. 3. When the FM modulator 2a shown in FIG. 15 is used in a radio communication system, the carrier wave frequency is not constant, that is, the carrier wave frequency can be changed. FIG. 3 shows an example where the first carrier wave frequency is changed to the desired frequency as time passes. In FIG. 3, in the time period from t0 to t1, the first carrier wave is in a steady state in the control circuit 202a, i.e., the digital PLL circuit. For example, in FIG. 3, the first carrier wave frequency starts to change to the desired frequency at time t1, and a sine wave having the desired frequency starts to be modulated at time t5.

In the fourth embodiment, the time, determined by the characteristic measurement time control section 211a, at which the f-V characteristic measurement is to be started is time t4 at which the second time period starts. In the fourth embodiment, the time, determined by the characteristic measurement time control section 211a, at which the f-V characteristic measurement is to be ended is a time at which the VCO gain correction section 204a completes the output of the necessary positive and negative digital values.

Figure 16:
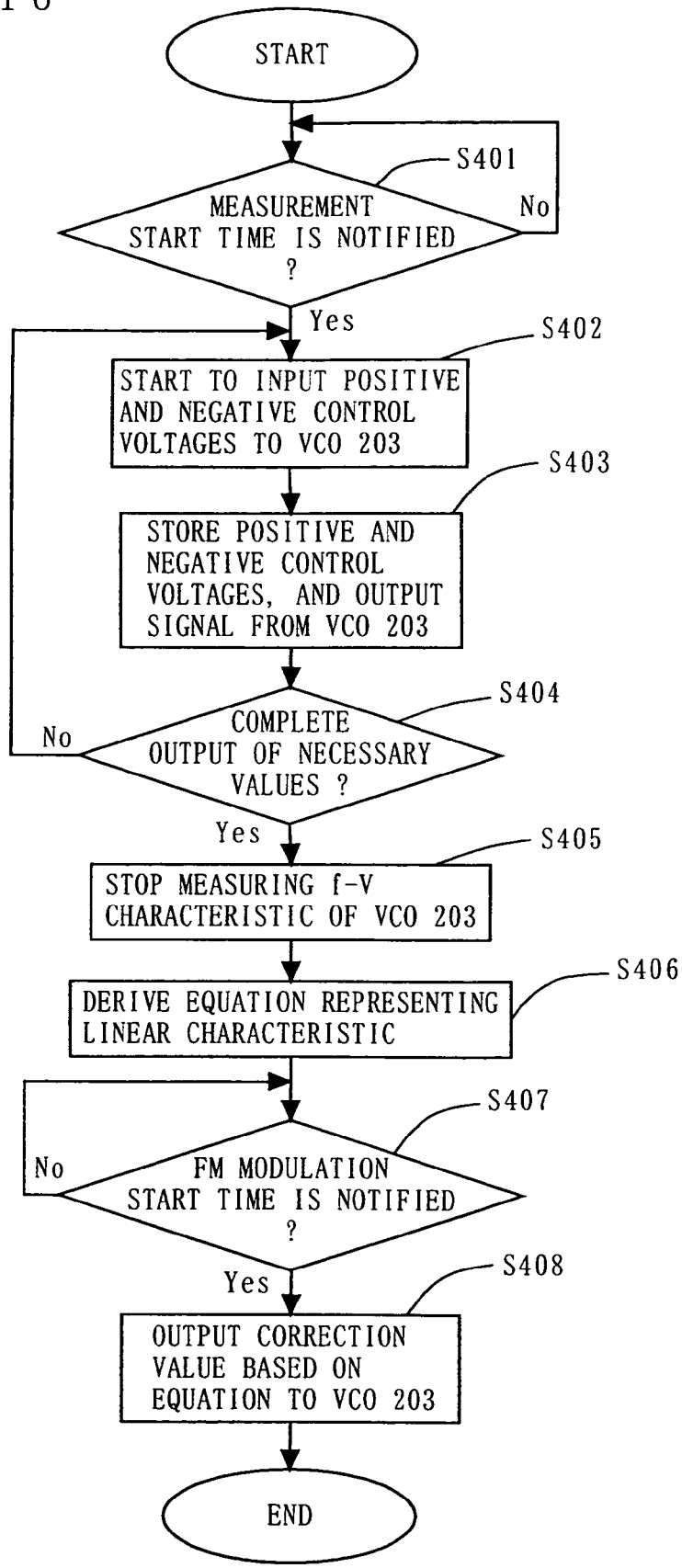
FIG. 16 is a flow chart of an operation performed by the VCO gain correction section 204a according to the fourth embodiment of the present invention.

An operation performed by the FM modulator 2a according to the fourth embodiment will be described in detail with reference to FIGS. 3, 15, and 16. FIG. 16 is a flow chart of an operation performed by the VCO gain correction section 204a according to the fourth embodiment With reference to FIG. 16, at time t1 at which the carrier wave frequency starts to change, the characteristic measurement time control section 211a detects for a change of the channel data. After the change of the channel data is detected, at time t4, the characteristic measurement time control section 211a notifies the VCO gain correction section 204a of the time at which the f-V characteristic measurement is to be started. The VCO gain correction section 204a determines in step S401 whether or not the VCO gain correction section 204a has been notified, by the characteristic measurement time control section 211a, of the time at which the f-V characteristic measurement is to be started. When the VCO gain correction section 204a has been notified of the time at which the f-V characteristic measurement is to be started, the process advances to step S402. On the other hand, when the VCO gain correction section 204a has not been notified of the time at which the f-V characteristic measurement is to be started, the process is returned to step S401.

In step S402, the VCO gain correction section 204a starts to supply a plurality of positive and negative control voltages to the VCO 203 so as to start the measurement of the f-V characteristic of the VCO 203. In step S403, the VCO gain correction section 204a stores the plurality of positive and negative control voltages outputted by the VCO gain correction section 204a associated with the output signals from the VCO 203, respectively.

Next, the VCO gain correction section 204a determines in step S404 whether or not the output of the necessary positive and negative control voltages has been completed. When the output has been completed, the process advances to step S405. On the other hand, when the output is not completed, the process is returned to step S402.

In step S405, the VCO gain correction section 204a ends the measurement of the f-V characteristic of the VCO 203.

Next, in step S406, the VCO gain correction section 204a derives an equation representing a linear characteristic of the VCO 203 based on the output signals from the VCO 203 and the plurality of positive and negative control voltages outputted by the VCO gain correction section 204a, both of which have been stored in the VCO gain correction section 204a.

Next, the VCO gain correction section 204a determines in step S407 whether or not the VCO gain correction section 204a has been notified, by the characteristic measurement time control section 211a, of the time at which the FM modulation using the desired frequency is to be started. When the VCO gain correction section 204a has been notified of the time at which the FM modulation using the desired frequency is to be started, the process advances to step S408. On the other hand, when the VCO gain correction section 204a has not been notified of the time at which the FM modulation using the desired frequency is to be started, the process is returned to step S407.

In step S408, the VCO gain correction section 204a calculates the correction value based on the input value from the adder 205 using the equation having been derived, and outputs the correction value to the VCO 203.

The method in which the VCO gain correction section 204a calculates the linear characteristic based on the f-V characteristic of the VCO 203 having been measured, and determines the correction value is the same as that described for the first embodiment.

As described above, according to the fourth embodiment, the VCO gain correction section 204a measures the f-V characteristic in the second time period. The VCO gain correction section 204a stores the output signals from the VCO 203, and the positive and negative control voltages, corresponding to only the necessary frequencies, outputted by the VCO gain correction section 204a. Therefore, the f-V characteristic of the VCO 203 can be measured in a reduced time period, and the capacity of memory allocated to the correction table can be reduced. The second time period is a time period indispensable to the locking of the PLL circuit. Therefore, in the fourth embodiment of the present invention, a time period, which has not been used in a conventional art, can be effectively utilized Further, the f-V characteristic of the VCO 203 is changed depending on a temperature and a reduction in power supply voltage. When the fourth embodiment of the present invention is used in a wireless system, a power amplifier which generates a large amount of heat when mounted in a substantially small device and the VCO 203 are mounted on the same substrate. Therefore, an error may occur in the correction signal outputted by the VCO gain correction section 204a while the FM modulator 2a is being operated. However, according to the fourth embodiment of the present invention, the VCO gain correction section 204a measures the f-V characteristic of the VCO 203 each time the carrier wave frequency is changed. Therefore, according to the fourth embodiment of the present invention, it is possible to suppress the error in the correction signal occurring due to the change of the f-V characteristic of the VCO 203 which is caused by the temperature change and the reduction in power supply voltage while the FM modulator 2a is being operated.

The time at which the VCO gain correction section 204a starts to measure the f-V characteristic of the VCO 203 may be other than time t4 shown in FIG. 3. For example, the VCO gain correction section 204*a* may start to measure the f-V characteristic of the VCO 203 at an arbitrary time in the second time period.

Figure 20:
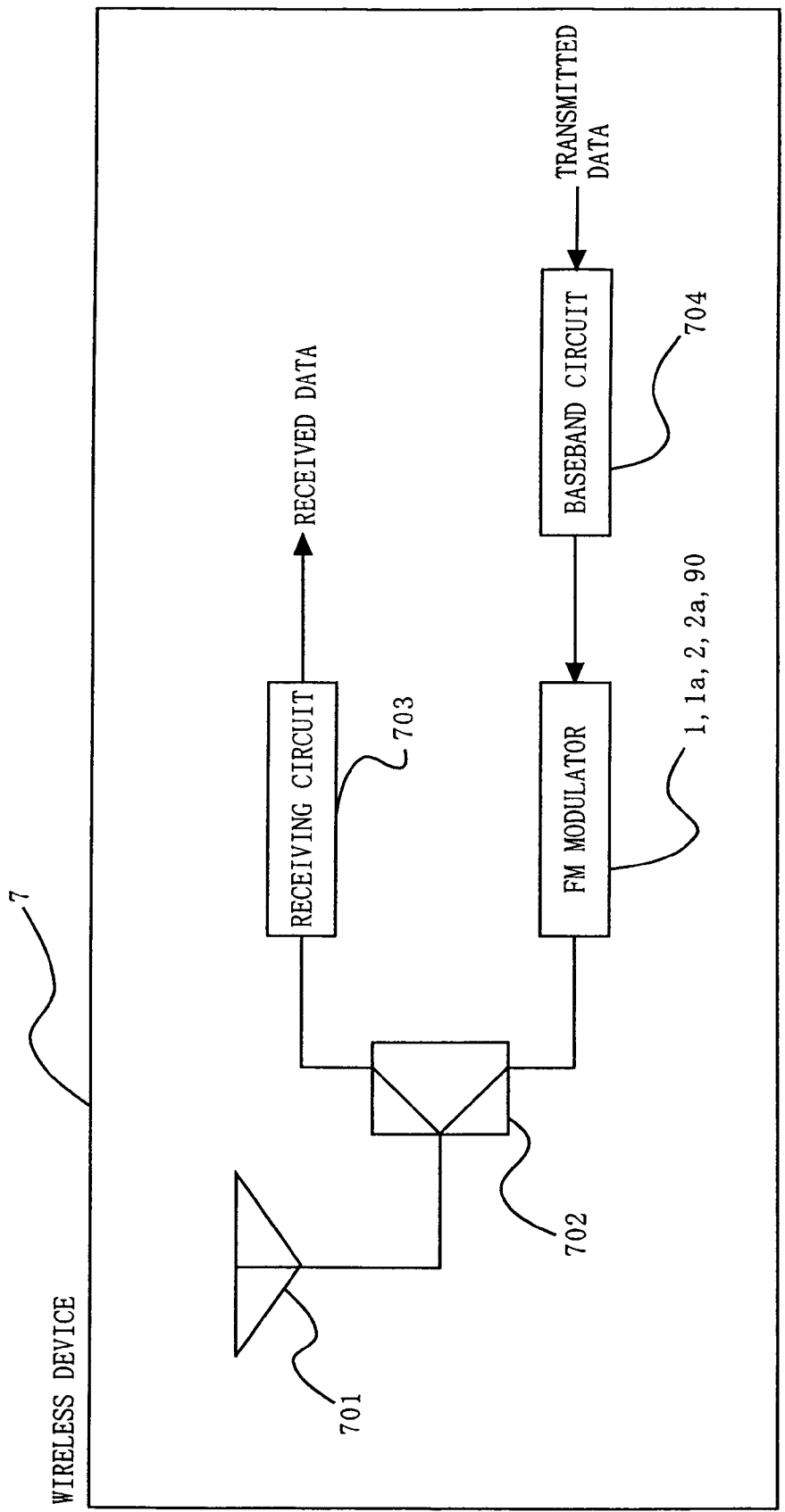
FIG. 20 is a diagram illustrating a wireless device including the FM modulator according to the present invention.

FIG. 20 is a diagram illustrating a wireless device 7 including a receiving circuit 703, an antenna 701 and a switch 702 and an FM modulator 1, 1*a*, 2, 2*a*, 90 according to the present invention in a transmission circuit including a baseband circuit 704. When the FM modulator 1, 1*a*, 2, 2*a*, 90 according to the present invention is included in the transmission circuit, the wireless 7 device enables reduction of a time period from the channel change start to the FM modulation start when the wireless device 7 is powered on.

While the invention has been described in detail, the foregoing description is in all aspects illustrative and not restrictive. It is understood that numerous other modifications and variations can be devised without departing from the scope of the invention.

What is claimed is:

1. An FM modulator for FM-modulating a signal containing a modulation component and outputting, as an output signal, a signal having been FM-modulated, comprising:
    a reference signal generator for generating a reference signal;
    a voltage controlled oscillator for outputting, as the output signal, a signal in accordance with a control voltage being applied thereto; and
    a control circuit for converging, to a predetermined frequency, an oscillation frequency of the voltage controlled oscillator using the reference signal, and, after the oscillation frequency has been converged to the predetermined frequency, changing, in accordance with the signal containing the modulation component, the control voltage to be applied to the voltage controlled oscillator, and causing the voltage controlled oscillator to output the output signal having been FM-modulated, wherein
    the control circuit includes a correction section for measuring, using the oscillation frequency of the voltage controlled oscillator and the control voltage to be applied to the voltage controlled oscillator, an f-V characteristic representing a relationship between the oscillation frequency and the control voltage, and applying, to the voltage controlled oscillator, the control voltage having been corrected in accordance with the f-V characteristic having been measured,
    the correction section measures the f-V characteristic while the oscillation frequency is being converged to the predetermined frequency, and applies, to the voltage controlled oscillator, the control voltage having been corrected in accordance with the f-V characteristic having been measured such that the voltage controlled oscillator outputs a signal equivalent to a signal outputted by a voltage controlled oscillator having a linear f-V characteristic, and
    the FM modulator further comprises a characteristic measurement time control section for notifying the correction section of a time at which the f-V characteristic is to be measured.

2. The FM modulator according to claim 1, wherein the control circuit converges the oscillation frequency to the predetermined frequency by performing a digital process.

3. The FM modulator according to claim 1, wherein the control circuit converges the oscillation frequency to the predetermined frequency by performing an analog process.

4. The FM modulator according to claim 1, wherein
    a phase locked loop circuit, including the control circuit and the voltage controlled oscillator, performs a process of converging the oscillation frequency to the predetermined frequency utilizing a first time period and a second time period,
    the first time period represents a time period from a start of the process to a time at which the oscillation frequency reaches a predetermined frequency range including the predetermined frequency,
    the second time period represents a time period from the time at which the oscillation frequency reaches the predetermined frequency range including the predetermined frequency to a time at which the oscillation frequency is locked, and
    the correction section measures the f-V characteristic in an arbitrary time period included in the first time period.

5. The FM modulator according to claim 4 wherein the correction section starts measuring the f-V characteristic at a beginning of the first time period, and ends measuring the f-V characteristic at an end of the first time period.

6. The FM modulator according to claim 4, wherein
    a phase of the oscillation frequency is repeatedly inverted in the first time period using the predetermined frequency as a reference until the oscillation frequency reaches the predetermined frequency range, and
    the correction section measures the f-V characteristic from an inflection point of the oscillation frequency to an immediately following inflection point of the oscillation frequency.

7. The FM modulator according to claim 4, wherein
    a phase of the oscillation frequency is repeatedly inverted in the first time period using the predetermined frequency as a reference until the oscillation frequency reaches the predetermined frequency range, and
    the correction section measures the f-V characteristic from a time at which the phase of the oscillation frequency is inverted to a time at which the phase of the oscillation frequency is inverted for a second time after the time at which the phase of the oscillation frequency is inverted.

8. The FM modulator according to claim 1, wherein
    a phase locked loop circuit, including the control circuit and the voltage controlled oscillator, performs a process of converging the oscillation frequency to the predetermined frequency utilizing a first time period and a second time period,
    the first time period represents a time period from a start of the process to a time at which the oscillation frequency reaches a predetermined frequency range including the predetermined frequency,
    the second time period represents a time period from the time at which the oscillation frequency reaches the predetermined frequency range including the predetermined frequency to a time at which the oscillation frequency is locked, and
    the correction section measures, in an arbitrary time period included in the second time period, the f-V characteristic necessary for performing an FM-modulation using the predetermined frequency by changing the control voltage to be applied to the voltage controlled oscillator.

9. The FM modulator according to claim 8 wherein the correction section staffs to measure the f-V characteristic at a beginning of the second time period, and, when the f-V characteristic necessary for performing the FM modulation using the predetermined frequency has been measured, stops correcting the control voltage.

10. The FM modulator according to claim 1, wherein the correction section measures the f-V characteristic after a channel outputted by the voltage controlled oscillator is changed.

11. The FM modulator according to claim 1, wherein the correction section measures the f-V characteristic after the FM modulator has been powered on.

12. A wireless device for transmitting an FM-modulated radio signal, comprising an FM modulator for FM-modulating a signal containing a modulation component and outputting, as an output signal, a signal having been FM-modulated, wherein the FM-modulator includes:

a reference signal generator for generating a reference signal;

a voltage controlled oscillator for outputting, as the output signal, a signal in accordance with a control voltage being applied thereto; and a control circuit for converging, to a predetermined frequency, an oscillation frequency of the voltage controlled oscillator using the reference signal, and, after the oscillation frequency has been converged to the predetermined frequency, changing, in accordance with the signal containing the modulation component, the control voltage to be applied to the voltage controlled oscillator, and causing the voltage controlled oscillator to output the output signal having been FM-modulated wherein the control circuit includes a correction section for measuring, using the oscillation frequency of the voltage controlled oscillator and the control voltage to be applied to the voltage controlled oscillator, an f-V characteristic representing a relationship between the oscillation frequency and the control voltage, and applying, to the voltage controlled oscillator, the control voltage having been corrected in accordance with the f-V characteristic having been measured, wherein the correction section measures the f-V characteristic while the oscillation frequency is being converged to the predetermined frequency, and applies, to the voltage controlled oscillator, the control voltage having been corrected in accordance with the f-V characteristic having been measured such that the voltage controlled oscillator outputs a signal equivalent to a signal outputted by a voltage controlled oscillator having a linear f-V characteristic, and wherein the FM modulator further comprises a characteristic measurement time control section for notifying the correction section of a time at which the f-V characteristic is to be measured.

\* \* \* \* \*

UNITED STATES PATENT AND TRADEMARK OFFICE
CERTIFICATE OF CORRECTION

PATENT NO. : 7,587,180 B2
APPLICATION NO. : 11/583176
DATED : September 8, 2009
INVENTOR(S) : Masakatsu Maeda et al.

It is certified that error appears in the above-identified patent and that said Letters Patent is hereby corrected as shown below:

In the Claims

In column 28, claim 9, line 59, "section staffs to measure" should read -- section starts to measure --.

Signed and Sealed this

Twenty-sixth Day of January, 2010

David J. Kappos
*Director of the United States Patent and Trademark Office*